US011085969B2

(12) United States Patent
Drees

(10) Patent No.: US 11,085,969 B2
(45) Date of Patent: Aug. 10, 2021

(54) ELECTRICAL ENERGY STORAGE SYSTEM WITH BATTERY RESISTANCE ESTIMATION

(71) Applicant: Con Edison Battery Storage, LLC, Valhalla, NY (US)

(72) Inventor: Kirk H. Drees, Cedarburg, WI (US)

(73) Assignee: CON EDISON BATTERY STORAGE, LLC, Valhalla, NY (US)

(*) Notice: Subject to any disclaimer, the term of this patent is extended or adjusted under 35 U.S.C. 154(b) by 0 days.

(21) Appl. No.: 16/595,981

(22) Filed: Oct. 8, 2019

(65) Prior Publication Data

US 2020/0088804 A1 Mar. 19, 2020

Related U.S. Application Data

(63) Continuation of application No. 15/406,596, filed on Jan. 13, 2017, now Pat. No. 10,436,851.

(Continued)

(51) Int. Cl.
*G01R 31/389* (2019.01)
*G01R 31/382* (2019.01)
(Continued)

(52) U.S. Cl.
CPC ......... *G01R 31/389* (2019.01); *G01R 31/382* (2019.01); *G01R 31/392* (2019.01);
(Continued)

(58) Field of Classification Search
CPC ...... G06K 1/00; G06K 2207/00; G06Q 10/00; G06N 3/00; G11B 3/00; G11B 2209/00
See application file for complete search history.

(56) References Cited

U.S. PATENT DOCUMENTS 5,795,664 A 8/1998 Kelly
9,653,936 B2 * 5/2017 Saint-Marcoux ....... B60L 58/15
(Continued)

FOREIGN PATENT DOCUMENTS

DE 102015117914 A1 5/2016
KR 1020150131773 A 11/2015
(Continued)

OTHER PUBLICATIONS

Schweiger et al., "Comparison of Several Methods for Determining the Internal Resistance of Lithium Ion Cells", Jun. 3, 2010, 22 pages.
(Continued)

*Primary Examiner* — Jermele M Hollington
*Assistant Examiner* — Temilade S Rhodes-Vivour
(74) *Attorney, Agent, or Firm* — Michael Best & Friedrich LLP

(57) ABSTRACT

An electrical energy storage system includes a battery container, one or more temperature sensors, and a controller. The battery container includes one or more batteries configured to store and discharge electrical energy. The temperature sensors are configured to measure one or more temperatures associated with the battery container. The controller is configured to estimate a rate of heat generation by the one or more batteries based on the measured temperatures, monitor an electric current provided to the one or more batteries, and estimate a resistance of the one or more batteries based on the estimated rate of heat generation and the electric current.

20 Claims, 5 Drawing Sheets

Related U.S. Application Data

(60) Provisional application No. 62/368,888, filed on Jul. 29, 2016.

(51) Int. Cl.
  *G01R 31/392* (2019.01)
  *H01M 10/42* (2006.01)
  *H01M 10/48* (2006.01)
  *G01R 31/367* (2019.01)
  *H02J 3/32* (2006.01)
  *G01R 31/396* (2019.01)

(52) U.S. Cl.
  CPC ....... *H01M 10/425* (2013.01); *H01M 10/486* (2013.01); *G01R 31/367* (2019.01); *G01R 31/396* (2019.01); *H01M 2220/10* (2013.01); *H02J 3/32* (2013.01)

(56) References Cited

U.S. PATENT DOCUMENTS

| | | | |
|---|---|---|---|
| 10,122,003 | B2 | 11/2018 | Hoshino |
| 10,147,976 | B2 | 12/2018 | Fukuhara |
| 10,186,889 | B2 | 1/2019 | Wenzel et al. |
| 10,190,793 | B2 | 1/2019 | Drees et al. |
| 10,197,632 | B2 | 2/2019 | Wenzel et al. |
| 10,222,427 | B2 | 3/2019 | Wenzel et al. |
| 10,250,039 | B2 | 4/2019 | Wenzel et al. |
| 10,283,968 | B2 | 5/2019 | Elbsat et al. |
| 10,333,187 | B2 | 6/2019 | Wakita et al. |
| 10,389,136 | B2 | 8/2019 | Drees |
| 10,418,832 | B2 | 9/2019 | Wenzel et al. |
| 10,418,833 | B2 | 9/2019 | Wenzel et al. |
| 10,436,851 | B2 | 10/2019 | Drees |
| 2004/0069546 | A1 | 4/2004 | Lou et al. |
| 2011/0245987 | A1* | 10/2011 | Pratt ............ H02J 13/00 700/295 |
| 2014/0312828 | A1* | 10/2014 | Vo ............ H01M 10/4257 320/103 |
| 2014/0328659 | A1 | 11/2014 | Marji |
| 2015/0021991 | A1* | 1/2015 | Wood ............ H02J 3/32 307/23 |
| 2015/0280294 | A1* | 10/2015 | Shin ............ B60L 58/26 429/50 |
| 2017/0102675 | A1 | 4/2017 | Drees |
| 2017/0103483 | A1 | 4/2017 | Drees et al. |
| 2017/0104342 | A1 | 4/2017 | Elbsat et al. |
| 2017/0104343 | A1 | 4/2017 | Elbsat et al. |
| 2017/0104449 | A1 | 4/2017 | Drees |
| 2018/0054061 | A1* | 2/2018 | Dorneanu ............ G05B 13/021 |

FOREIGN PATENT DOCUMENTS

| | | |
|---|---|---|
| WO | 2008058284 A2 | 5/2008 |
| WO | 2008058284 A3 | 5/2008 |
| WO | 2016091577 A1 | 6/2016 |

OTHER PUBLICATIONS

Vertiz et al, "Thermal Characterization of Large Size Lithium-Ion Pouch Cell Based on 1 d Electro-Thermal Model", 2014, 9 pages.
Search Report for International Application No. PCT/US2017/014191, dated Apr. 19, 2017, 18 pages.

* cited by examiner

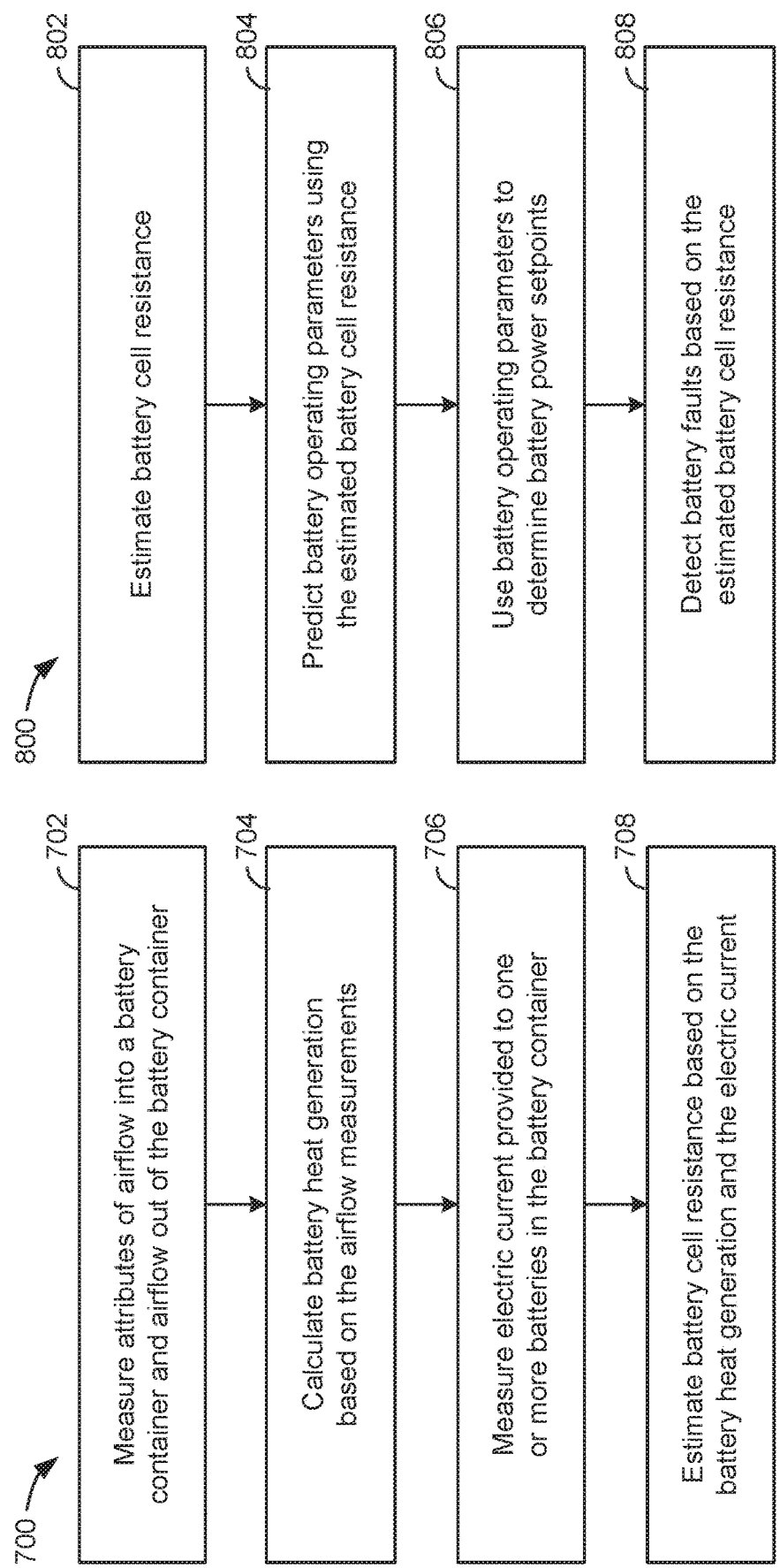

ELECTRICAL ENERGY STORAGE SYSTEM WITH BATTERY RESISTANCE ESTIMATION

CROSS-REFERENCE TO RELATED PATENT APPLICATIONS

This application is a continuation of U.S. patent application Ser. No. 15/406,596, filed Jan. 13, 2017, now U.S. Pat. No. 10,436,851, which claims the benefit of and priority to U.S. Provisional Patent Application No. 62/368,888, filed Jul. 29, 2016, the entire disclosures of both of which are incorporated by reference herein.

BACKGROUND

The present disclosure relates generally to an electrical energy storage system. The present disclosure relates more particularly to an electrical energy storage system which estimates the internal cell resistance of batteries used to store electrical energy.

Electrical energy storage (e.g., batteries) can be used for several applications, two of which are ramp rate control and frequency regulation. Ramp rate control is the process of offsetting ramp rates (i.e., increases or decreases in the power output of an energy system such as a photovoltaic energy system) that fall outside of compliance limits determined by the electric power authority overseeing the energy grid. Ramp rate control typically requires the use of an energy source that allows for offsetting ramp rates by either supplying additional power to the grid or consuming more power from the grid. In some instances, a facility is penalized for failing to comply with ramp rate requirements.

Frequency regulation (also referred to as frequency response) is the process of maintaining the grid frequency at a desired value (e.g. 60 Hz in the United States) by adding or removing energy from the grid as needed. During a fluctuation of the grid frequency, a frequency regulation system may offset the fluctuation by either drawing more energy from the energy grid (e.g., if the grid frequency is too high) or by providing energy to the energy grid (e.g., if the grid frequency is too low). A facility participating in a frequency regulation program may receive a regulation signal from a utility or other entity responsible for regulating the frequency of the energy grid. In response to the regulation signal, the facility adds or removes energy from the energy grid. The facility may be provided with monetary incentives or awards in exchange for participating in the frequency regulation program.

Storing electrical energy in a battery may allow a facility to perform frequency regulation and/or ramp rate control. However, repeatedly charging and discharging the battery may cause battery degradation and reduce battery life. Battery degradation can affect various operating parameters such as the battery's maximum state of charge and charging/discharging power. Changes in these parameters can decrease the battery's ability to store and discharge energy and can reduce the potential for participating in frequency regulation programs. Optimal battery control often relies upon accurate values for these operating parameters. However, it can be difficult to measure battery degradation and predict the resultant change in battery operating parameters.

SUMMARY

One implementation of the present disclosure is an electrical energy storage system. The system includes a battery container including one or more batteries configured to store and discharge electrical energy, one or more temperature sensors configured to measure one or more temperatures associated with the battery container, and a controller. The controller is configured to estimate a rate of heat generation by the one or more batteries based on the measured temperatures, monitor an electric current provided to the one or more batteries, and estimate a resistance of the one or more batteries based on the estimated rate of heat generation and the electric current.

In some embodiments, the controller is configured to calculate one or more operating parameters of the batteries based on the estimated resistance. The operating parameters may include at least one of a maximum state-of-charge of the batteries, a maximum charging/discharging power of the batteries, a power storage efficiency of the batteries, and/or a health of the batteries. In some embodiments, the controller is configured to use the calculated operating parameters to generate battery power setpoints for the one or more batteries.

In some embodiments, the controller is configured to monitor the estimated resistance of the one or more batteries over time and detect a fault in the electrical energy storage system in response to the estimated resistance crossing a resistance threshold.

In some embodiments, the controller is configured to apply the estimated resistance of the one or more batteries as an input to a battery life model and use the battery life model to predict a remaining life of the one or more batteries as a function of the estimated resistance.

In some embodiments, the controller is configured to estimate the rate of heat generation by the one or more batteries by calculating a rate of heat flow into the battery container, calculating a rate of heat flow out of the battery container, and subtracting the rate of heat flow into the battery container from the rate of heat flow out of the battery container to determine the rate of heat generation by the one or more batteries.

In some embodiments, the one or more temperature sensors include a supply air temperature sensor configured to measure a temperature of supply air provided to battery container and a return air temperature sensor configured to measure a temperature of return air returning from the battery container. In some embodiments, the controller is configured to calculate a rate of heat flow into the battery container based on the measured temperature of the supply air, calculate a rate of heat flow out of the battery container based on the measured temperature of the return air, and estimate the rate of the heat generation by the one or more batteries based on a difference between the rate of heat flow out of the battery container and the rate of heat flow into the battery container.

In some embodiments, the system includes an HVAC system configured to provide cooling for the battery container. The controller can be configured to estimate the rate of heat generation by the one or more batteries based on a rate at which heat is removed from the battery container by the HVAC system.

In some embodiments, the controller is configured to estimate the rate of heat generation by the one or more batteries at each of a plurality of time steps within a time horizon, determine the electric current provided to the one or more batteries at each of the plurality of time steps, generate an integrated heat generation value and an integrated electric current value by integrating the estimated rates of heat generation and the determined electric currents over the time horizon, and estimate the resistance of the one or more batteries based on the integrated heat generation value and the integrated electric current value.

Another implementation of the present disclosure is a method for operating an electrical energy storage system. The method includes storing and discharging electrical energy in one or more batteries within a battery container, measuring one or more temperatures associated with the battery container, estimating a rate of heat generation by the one or more batteries based on the measured temperatures, monitoring an electric current provided to the one or more batteries, and estimating a resistance of the one or more batteries based on the estimated rate of heat generation and the electric current.

In some embodiments, the method includes calculating one or more operating parameters of the batteries based on the estimated resistance. The operating parameters may include at least one of a maximum state-of-charge of the batteries, a maximum charging/discharging power of the batteries, a power storage efficiency of the batteries, and/or a health of the batteries. In some embodiments, the method includes using the calculated operating parameters to generate battery power setpoints for the one or more batteries.

In some embodiments, the method includes monitoring the estimated resistance of the one or more batteries over time and detecting a fault in the electrical energy storage system in response to the estimated resistance crossing a resistance threshold.

In some embodiments, the method includes applying the estimated resistance of the one or more batteries as an input to a battery life model and using the battery life model to predict a remaining life of the one or more batteries as a function of the estimated resistance.

In some embodiments, estimating the rate of heat generation by the one or more batteries includes calculating a rate of heat flow into the battery container, calculating a rate of heat flow out of the battery container, and subtracting the rate of heat flow into the battery container from the rate of heat flow out of the battery container to determine the rate of heat generation by the one or more batteries.

In some embodiments, measuring the one or more temperatures associated with the battery container includes measuring a temperature of supply air provided to battery container and measuring a temperature of return air returning from the battery container. In some embodiments, estimating the rate of heat generation by the one or more batteries includes calculating a rate of heat flow into the battery container based on the measured temperature of the supply air, calculating a rate of heat flow out of the battery container based on the measured temperature of the return air, and estimating the rate of the heat generation by the one or more batteries based on a difference between the rate of heat flow out of the battery container and the rate of heat flow into the battery container.

In some embodiments, the method includes operating an HVAC system to provide cooling for the battery container. The rate of heat generation by the one or more batteries may be estimated based on a rate at which heat is removed from the battery container by the HVAC system.

In some embodiments, the method includes estimating the rate of heat generation by the one or more batteries at each of a plurality of time steps within a time horizon, determining the electric current provided to the one or more batteries at each of the plurality of time steps, generating an integrated heat generation value and an integrated electric current value by integrating the estimated rates of heat generation and the determined electric currents over the time horizon, and estimating the resistance of the one or more batteries based on the integrated heat generation value and the integrated electric current value.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

FIG. 7 is a flow diagram of a process which can be performed by the electrical energy storage system of FIG. 5 to estimate battery cell resistance, according to an exemplary embodiment.

FIG. 8 is a flow diagram of a process which can be performed by the electrical energy storage system of FIG. 5 to calculate operating parameters, estimate remaining battery life, predict faults, and determine battery power setpoints based on an estimated battery cell resistance, according to an exemplary embodiment.

DETAILED DESCRIPTION

Overview

Figure 1:
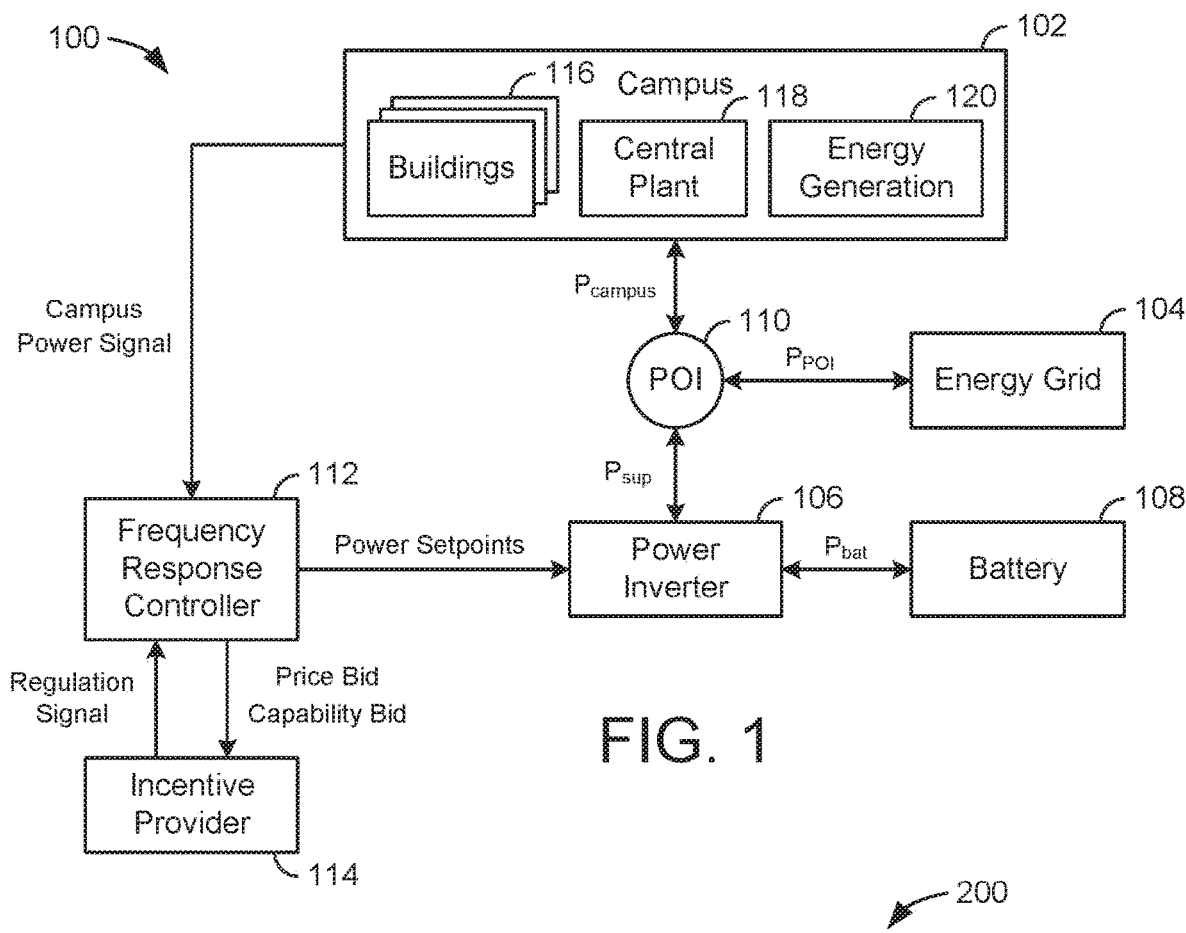
FIG. 1 is a block diagram of a frequency response optimization system, according to an exemplary embodiment.

Referring generally to the FIGURES, systems and methods for controlling and using electrical energy storage are shown, according to various exemplary embodiments. Storing electrical energy in a battery may allow a facility to perform frequency regulation and/or ramp rate control. However, repeatedly charging and discharging the battery may cause battery degradation and reduce battery life. Battery degradation can affect various operating parameters such as the battery's maximum state of charge and charging/discharging power. Changes in these parameters can decrease the battery's ability to store and discharge energy and can reduce the potential for participating in frequency regulation programs. Optimal battery control often relies upon accurate values for these operating parameters. However, it can be difficult to measure battery degradation and predict the resultant change in battery operating parameters.

The systems and methods described herein use the internal cell resistance of the battery to quantify battery degradation. Battery cell resistance is a good indicator of battery health and remaining battery life. Advantageously, the systems and methods of the present disclosure estimate battery cell resistance based on the amount of heat generated by the battery and the battery current. For example, battery heat generation can be modeled using the following equation:

$$\dot{Q}_{bat} = i^2 R_{cell}$$

where $\dot{Q}_{bat}$ is the rate of heat generation by the battery, i is the electric current through the battery, and $R_{cell}$ is the internal cell resistance of the battery. Battery current i can be measured directly, whereas battery heat generation $\dot{Q}_{bat}$ can be calculated based on data from a HVAC system used to cool the battery.

In some embodiments, the battery includes a collection of battery cells or modules that are connected into strings to achieve the desired voltage. The battery strings can be arranged in parallel with one another and packaged in a closed battery container. The battery container can be cooled by a HVAC system to remove the heat $\dot{Q}_{bat}$ generated by the battery. The battery heat generation $\dot{Q}_{bat}$ can be calculated based on data from the HVAC system. For example, the battery container can be insulated such that the only heat transfer into or out of the battery container is via the HVAC system. Temperature and airflow measurements from the HVAC system can be used to determine the heat transfer $\dot{Q}_{in}$ into the battery container (e.g., via a supply air duct) and heat transfer $\dot{Q}_{out}$ out of the battery container (e.g., via a return air duct). The battery heat generation $\dot{Q}_{bat}$ can be calculated as the difference between $\dot{Q}_{out}$ and $\dot{Q}_{in}$ (e.g., $\dot{Q}_{bat} = \dot{Q}_{out} - \dot{Q}_{in}$). The battery cell resistance $R_{cell}$ can then be calculated based on the battery heat generation $\dot{Q}_{bat}$.

The battery cell resistance $R_{cell}$ can be used to predict battery operating parameters (e.g., maximum state of charge, maximum charging or discharging power, etc.), which can be used by a battery controller to determine optimal battery power setpoints. The battery cell resistance $R_{cell}$ can also be used in a battery life model as an indicator of remaining battery life. In some embodiments, the battery cell resistance $R_{cell}$ can be used to detect faults in the electrical energy storage system. For example, the battery cell resistance $R_{cell}$ can be monitored over time and compared to a threshold value. The battery controller can output a fault indication in response to a determination that the battery cell resistance $R_{cell}$ has crossed the threshold value. A history of values of the battery cell resistance $R_{cell}$ can be used to generate a function or model (e.g., a battery degradation model) which predicts future values of the battery cell resistance $R_{cell}$ and/or battery health. The model can be used to predict future battery faults and project battery health into the future.

The following sections of this disclosure describe the battery cell resistance estimation technique in greater detail as well as several electrical energy storage systems which can use the estimation technique. For example, the battery cell resistance estimation technique can be used in a frequency response optimization system. The frequency response implementation is described with reference to FIGS. 1-2. The battery cell resistance estimation technique can also be used in a photovoltaic (PV) energy system that simultaneously performs both frequency regulation and ramp rate control. The PV energy system implementation is described with reference to FIGS. 3-4. The battery cell resistance estimation technique is described in greater detail with reference to FIGS. 5-7.

Frequency Response Optimization

Referring now to FIG. 1, a frequency response optimization system 100 is shown, according to an exemplary embodiment. System 100 is shown to include a campus 102 and an energy grid 104. Campus 102 may include one or more buildings 116 that receive power from energy grid 104. Buildings 116 may include equipment or devices that consume electricity during operation. For example, buildings 116 may include HVAC equipment, lighting equipment, security equipment, communications equipment, vending machines, computers, electronics, elevators, or other types of building equipment. In some embodiments, buildings 116 are served by a building management system (BMS). A BMS is, in general, a system of devices configured to control, monitor, and manage equipment in or around a building or building area. A BMS can include, for example, a HVAC system, a security system, a lighting system, a fire alerting system, and/or any other system that is capable of managing building functions or devices. An exemplary building management system which may be used to monitor and control buildings 116 is described in U.S. patent application Ser. No. 14/717,593, titled "Building Management System for Forecasting Time Series Values of Building Variables" and filed May 20, 2015, the entire disclosure of which is incorporated by reference herein.

In some embodiments, campus 102 includes a central plant 118. Central plant 118 may include one or more subplants that consume resources from utilities (e.g., water, natural gas, electricity, etc.) to satisfy the loads of buildings 116. For example, central plant 118 may include a heater subplant, a heat recovery chiller subplant, a chiller subplant, a cooling tower subplant, a hot thermal energy storage (TES) subplant, and a cold thermal energy storage (TES) subplant, a steam subplant, and/or any other type of subplant configured to serve buildings 116. The subplants may be configured to convert input resources (e.g., electricity, water, natural gas, etc.) into output resources (e.g., cold water, hot water, chilled air, heated air, etc.) that are provided to buildings 116. An exemplary central plant which may be used to satisfy the loads of buildings 116 is described U.S. patent application Ser. No. 14/634,609, titled "High Level Central Plant Optimization" and filed Feb. 27, 2015, the entire disclosure of which is incorporated by reference herein.

In some embodiments, campus 102 includes energy generation 120. Energy generation 120 may be configured to generate energy that can be used by buildings 116, used by central plant 118, and/or provided to energy grid 104. In some embodiments, energy generation 120 generates electricity. For example, energy generation 120 may include an electric power plant, a photovoltaic energy field, or other types of systems or devices that generate electricity. The electricity generated by energy generation 120 can be used internally by campus 102 (e.g., by buildings 116 and/or campus 118) to decrease the amount of electric power that campus 102 receives from outside sources such as energy grid 104 or battery 108. If the amount of electricity generated by energy generation 120 exceeds the electric power demand of campus 102, the excess electric power can be provided to energy grid 104 or stored in battery 108. The power output of campus 102 is shown in FIG. 1 as $P_{campus}$. $P_{campus}$ may be positive if campus 102 is outputting electric power or negative if campus 102 is receiving electric power.

Still referring to FIG. 1, system 100 is shown to include a power inverter 106 and a battery 108. Power inverter 106 may be configured to convert electric power between direct current (DC) and alternating current (AC). For example, battery 108 may be configured to store and output DC power, whereas energy grid 104 and campus 102 may be configured to consume and generate AC power. Power inverter 106 may be used to convert DC power from battery 108 into a sinusoidal AC output synchronized to the grid frequency of energy grid 104. Power inverter 106 may also be used to convert AC power from campus 102 or energy grid 104 into DC power that can be stored in battery 108. The power output of battery 108 is shown as $P_{bat}$. $P_{bat}$ may be positive if battery 108 is providing power to power inverter 106 or negative if battery 108 is receiving power from power inverter 106.

In some instances, power inverter 106 receives a DC power output from battery 108 and converts the DC power output to an AC power output that can be fed into energy grid 104. Power inverter 106 may synchronize the frequency of the AC power output with that of energy grid 104 (e.g., 50 Hz or 60 Hz) using a local oscillator and may limit the voltage of the AC power output to no higher than the grid voltage. In some embodiments, power inverter 106 is a resonant inverter that includes or uses LC circuits to remove the harmonics from a simple square wave in order to achieve a sine wave matching the frequency of energy grid 104. In various embodiments, power inverter 106 may operate using high-frequency transformers, low-frequency transformers, or without transformers. Low-frequency transformers may convert the DC output from battery 108 directly to the AC output provided to energy grid 104. High-frequency transformers may employ a multi-step process that involves converting the DC output to high-frequency AC, then back to DC, and then finally to the AC output provided to energy grid 104.

System 100 is shown to include a point of interconnection (POI) 110. POI 110 is the point at which campus 102, energy grid 104, and power inverter 106 are electrically connected. The power supplied to POI 110 from power inverter 106 is shown as $P_{sup}$. $P_{sup}$ may be defined as $P_{bat}+P_{loss}$, where $P_{batt}$ is the battery power and $P_{loss}$ is the power loss in the battery system (e.g., losses in power inverter 106 and/or battery 108). $P_{sup}$ may be positive is power inverter 106 is providing power to POI 110 or negative if power inverter 106 is receiving power from POI 110. $P_{campus}$ and $P_{sup}$ combine at POI 110 to form $P_{POI}$. $P_{POI}$ may be defined as the power provided to energy grid 104 from POI 110. $P_{POI}$ may be positive if POI 110 is providing power to energy grid 104 or negative if POI 110 is receiving power from energy grid 104.

Still referring to FIG. 1, system 100 is shown to include a frequency response controller 112. Controller 112 may be configured to generate and provide power setpoints to power inverter 106. Power inverter 106 may use the power setpoints to control the amount of power $P_{sup}$ provided to POI 110 or drawn from POI 110. For example, power inverter 106 may be configured to draw power from POI 110 and store the power in battery 108 in response to receiving a negative power setpoint from controller 112. Conversely, power inverter 106 may be configured to draw power from battery 108 and provide the power to POI 110 in response to receiving a positive power setpoint from controller 112. The magnitude of the power setpoint may define the amount of power $P_{sup}$ provided to or from power inverter 106. Controller 112 may be configured to generate and provide power setpoints that optimize the value of operating system 100 over a time horizon.

In some embodiments, frequency response controller 112 uses power inverter 106 and battery 108 to perform frequency regulation for energy grid 104. Frequency regulation is the process of maintaining the stability of the grid frequency (e.g., 60 Hz in the United States). The grid frequency may remain stable and balanced as long as the total electric supply and demand of energy grid 104 are balanced. Any deviation from that balance may result in a deviation of the grid frequency from its desirable value. For example, an increase in demand may cause the grid frequency to decrease, whereas an increase in supply may cause the grid frequency to increase. Frequency response controller 112 may be configured to offset a fluctuation in the grid frequency by causing power inverter 106 to supply energy from battery 108 to energy grid 104 (e.g., to offset a decrease in grid frequency) or store energy from energy grid 104 in battery 108 (e.g., to offset an increase in grid frequency).

In some embodiments, frequency response controller 112 uses power inverter 106 and battery 108 to perform load shifting for campus 102. For example, controller 112 may cause power inverter 106 to store energy in battery 108 when energy prices are low and retrieve energy from battery 108 when energy prices are high in order to reduce the cost of electricity required to power campus 102. Load shifting may also allow system 100 reduce the demand charge incurred. Demand charge is an additional charge imposed by some utility providers based on the maximum power consumption during an applicable demand charge period. For example, a demand charge rate may be specified in terms of dollars per unit of power (e.g., $/kW) and may be multiplied by the peak power usage (e.g., kW) during a demand charge period to calculate the demand charge. Load shifting may allow system 100 to smooth momentary spikes in the electric demand of campus 102 by drawing energy from battery 108 in order to reduce peak power draw from energy grid 104, thereby decreasing the demand charge incurred.

Still referring to FIG. 1, system 100 is shown to include an incentive provider 114. Incentive provider 114 may be a utility (e.g., an electric utility), a regional transmission organization (RTO), an independent system operator (ISO), or any other entity that provides incentives for performing frequency regulation. For example, incentive provider 114 may provide system 100 with monetary incentives for participating in a frequency response program. In order to participate in the frequency response program, system 100 may maintain a reserve capacity of stored energy (e.g., in battery 108) that can be provided to energy grid 104. System 100 may also maintain the capacity to draw energy from energy grid 104 and store the energy in battery 108. Reserving both of these capacities may be accomplished by managing the state-of-charge of battery 108.

Frequency response controller 112 may provide incentive provider 114 with a price bid and a capability bid. The price bid may include a price per unit power (e.g., $/MW) for reserving or storing power that allows system 100 to participate in a frequency response program offered by incentive provider 114. The price per unit power bid by frequency response controller 112 is referred to herein as the "capability price." The price bid may also include a price for actual performance, referred to herein as the "performance price." The capability bid may define an amount of power (e.g., MW) that system 100 will reserve or store in battery 108 to perform frequency response, referred to herein as the "capability bid."

Incentive provider 114 may provide frequency response controller 112 with a capability clearing price $CP_{cap}$, a performance clearing price $CP_{perf}$ and a regulation award $Reg_{award}$, which correspond to the capability price, the performance price, and the capability bid, respectively. In some embodiments, $CP_{cap}$, $CP_{perf}$ and $Reg_{award}$ are the same as the corresponding bids placed by controller 112. In other embodiments, $CP_{cap}$, $CP_{perf}$, and $Reg_{award}$ may not be the same as the bids placed by controller 112. For example, $CP_{cap}$, $CP_{perf}$, and $Reg_{award}$ may be generated by incentive provider 114 based on bids received from multiple participants in the frequency response program. Controller 112 may use $CP_{cap}$, $CP_{perf}$, and $Reg_{award}$ to perform frequency regulation.

Frequency response controller 112 is shown receiving a regulation signal from incentive provider 114. The regulation signal may specify a portion of the regulation award $Reg_{award}$ that frequency response controller 112 is to add or remove from energy grid 104. In some embodiments, the regulation signal is a normalized signal (e.g., between −1 and 1) specifying a proportion of $Reg_{award}$. Positive values of the regulation signal may indicate an amount of power to add to energy grid 104, whereas negative values of the regulation signal may indicate an amount of power to remove from energy grid 104.

Frequency response controller 112 may respond to the regulation signal by generating an optimal power setpoint for power inverter 106. The optimal power setpoint may take into account both the potential revenue from participating in the frequency response program and the costs of participation. Costs of participation may include, for example, a monetized cost of battery degradation as well as the energy and demand charges that will be incurred. The optimization may be performed using sequential quadratic programming, dynamic programming, or any other optimization technique.

In some embodiments, controller 112 uses a battery life model to quantify and monetize battery degradation as a function of the power setpoints provided to power inverter 106. Advantageously, the battery life model allows controller 112 to perform an optimization that weighs the revenue generation potential of participating in the frequency response program against the cost of battery degradation and other costs of participation (e.g., less battery power available for campus 102, increased electricity costs, etc.). An exemplary regulation signal and power response are described in greater detail with reference to FIG. 2.

Figure 2:
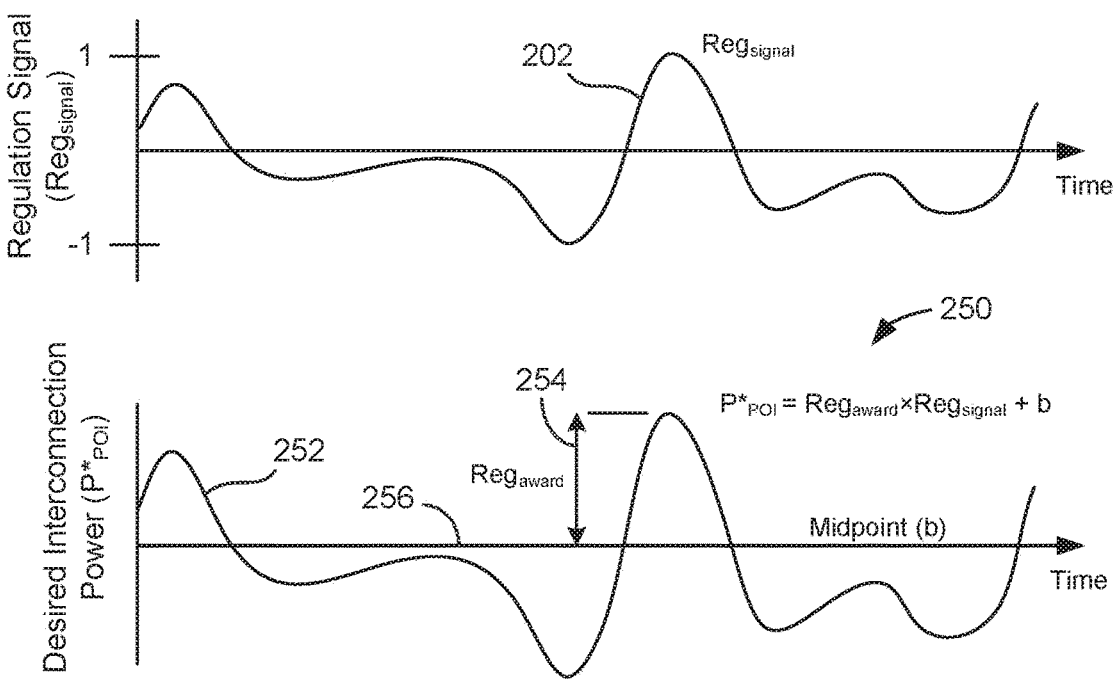
FIG. 2 is a graph of a regulation signal which may be provided to the system of FIG. 1 and a frequency response signal which may be generated by the system of FIG. 1, according to an exemplary embodiment.

Referring now to FIG. 2, a pair of frequency response graphs 200 and 250 are shown, according to an exemplary embodiment. Graph 200 illustrates a regulation signal $Reg_{signal}$ 202 as a function of time. $Reg_{signal}$ 202 is shown as a normalized signal ranging from −1 to 1 (i.e., $-1 \leq Reg_{signal} \leq 1$). $Reg_{signal}$ 202 may be generated by incentive provider 114 and provided to frequency response controller 112. $Reg_{signal}$ 202 may define a proportion of the regulation award $Reg_{award}$ 254 that controller 112 is to add or remove from energy grid 104, relative to a baseline value referred to as the midpoint b 256. For example, if the value of $Reg_{award}$ 254 is 10 MW, a regulation signal value of 0.5 (i.e., $Reg_{signal}$=0.5) may indicate that system 100 is requested to add 5 MW of power at POI 110 relative to midpoint b (e.g., $P^*_{POI}$=10 MW×0.5+b), whereas a regulation signal value of −0.3 may indicate that system 100 is requested to remove 3 MW of power from POI 110 relative to midpoint b (e.g., $P^*_{POI}$=10 MW×−0.3+b).

Graph 250 illustrates the desired interconnection power $P^*_{POI}$ 252 as a function of time. $P^*_{POI}$ 252 may be calculated by frequency response controller 112 based on $Reg_{signal}$ 202, $Reg_{award}$ 254, and a midpoint b 256. For example, controller 112 may calculate $P^*_{POI}$ 252 using the following equation:

$$P^*_{POI}=Reg_{award} \times Reg_{signal}+b$$

where $P^*_{POI}$ represents the desired power at POI 110 (e.g., $P^*_{POI}=P_{sup}+P_{campus}$) and b is the midpoint. Midpoint b may be defined (e.g., set or optimized) by controller 112 and may represent the midpoint of regulation around which the load is modified in response to $Reg_{signal}$ 202. Optimal adjustment of midpoint b may allow controller 112 to actively participate in the frequency response market while also taking into account the energy and demand charge that will be incurred.

In order to participate in the frequency response market, controller 112 may perform several tasks. Controller 112 may generate a price bid (e.g., $/MW) that includes the capability price and the performance price. In some embodiments, controller 112 sends the price bid to incentive provider 114 at approximately 15:30 each day and the price bid remains in effect for the entirety of the next day. Prior to beginning a frequency response period, controller 112 may generate the capability bid (e.g., MW) and send the capability bid to incentive provider 114. In some embodiments, controller 112 generates and sends the capability bid to incentive provider 114 approximately 1.5 hours before a frequency response period begins. In an exemplary embodiment, each frequency response period has a duration of one hour; however, it is contemplated that frequency response periods may have any duration.

At the start of each frequency response period, controller 112 may generate the midpoint b around which controller 112 plans to perform frequency regulation. In some embodiments, controller 112 generates a midpoint b that will maintain battery 108 at a constant state-of-charge (SOC) (i.e. a midpoint that will result in battery 108 having the same SOC at the beginning and end of the frequency response period). In other embodiments, controller 112 generates midpoint b using an optimization procedure that allows the SOC of battery 108 to have different values at the beginning and end of the frequency response period. For example, controller 112 may use the SOC of battery 108 as a constrained variable that depends on midpoint b in order to optimize a value function that takes into account frequency response revenue, energy costs, and the cost of battery degradation. Exemplary processes for calculating and/or optimizing midpoint b under both the constant SOC scenario and the variable SOC scenario are described in detail in U.S. Provisional Patent Application No. 62/239,246 filed Oct. 8, 2015, the entire disclosure of which is incorporated by reference herein.

During each frequency response period, controller 112 may periodically generate a power setpoint for power inverter 106. For example, controller 112 may generate a power setpoint for each time step in the frequency response period. In some embodiments, controller 112 generates the power setpoints using the equation:

$$P^*_{POI}=Reg_{award} \times Reg_{signal}+b$$

where $P^*_{POI}=P_{sup}+P_{campus}$. Positive values of $P^*_{POI}$ indicate energy flow from POI 110 to energy grid 104. Positive values of $P_{sup}$ and $P_{campus}$ indicate energy flow to POI 110 from power inverter 106 and campus 102, respectively. In other embodiments, controller 112 generates the power setpoints using the equation:

$$P^*_{POI}=Reg_{award} \times Res_{FR}+b$$

where $Res_{FR}$ is an optimal frequency response generated by optimizing a value function. Controller 112 may subtract $P_{campus}$ from $P^*_{POI}$ to generate the power setpoint for power inverter 106 (i.e., $P_{sup}=P_{POI}-P_{campus}$). The power setpoint for power inverter 106 indicates the amount of power that power inverter 106 is to add to POI 110 (if the power setpoint is positive) or remove from POI 110 (if the power setpoint is negative). Exemplary processes for calculating power inverter setpoints are described in detail in U.S. Provisional Patent Application No. 62/239,246.

Photovoltaic Energy System with Frequency Regulation and Ramp Rate Control

Figure 3:
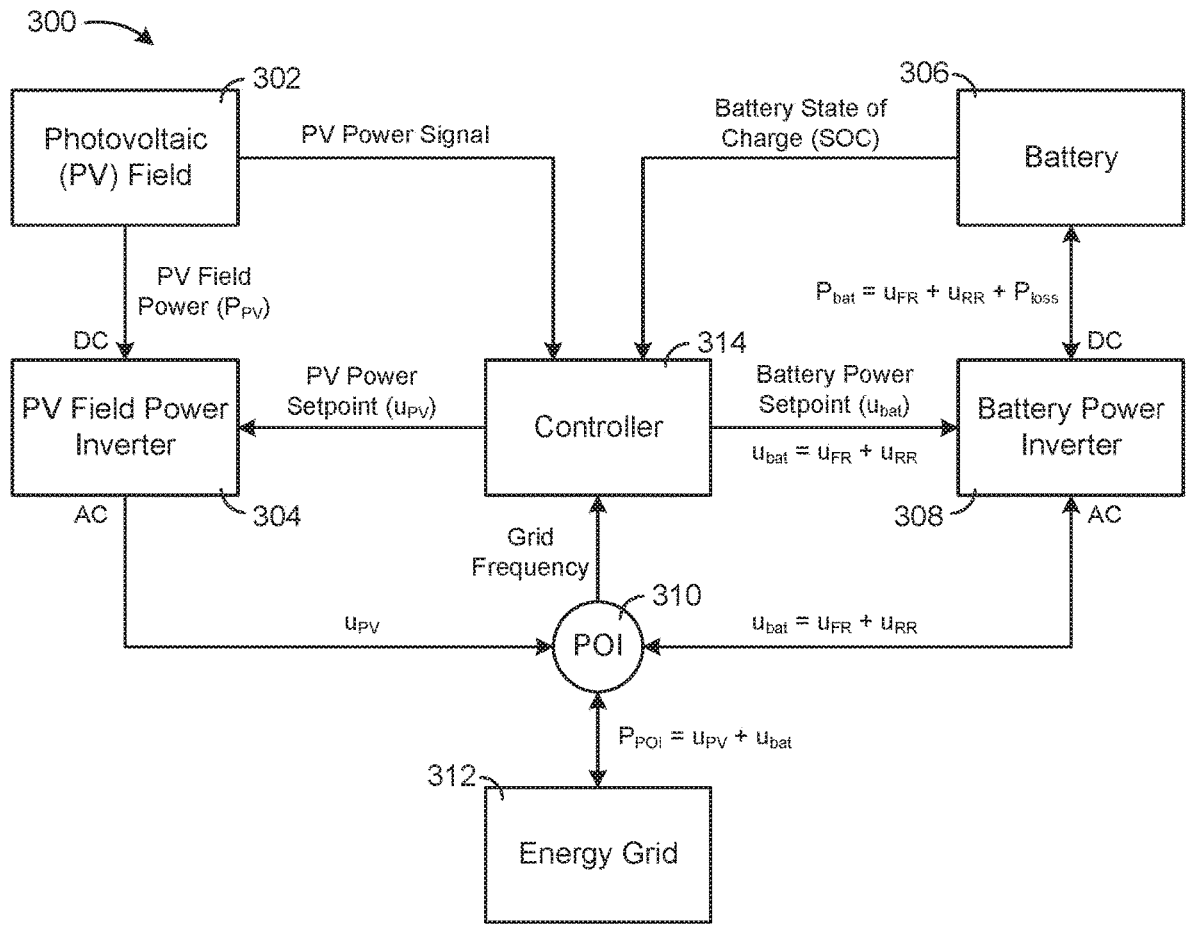
FIG. 3 is a block diagram of a photovoltaic energy system configured to simultaneously perform both ramp rate control and frequency regulation while maintaining the state-of-charge of a battery within a desired range, according to an exemplary embodiment.
Figure 4:
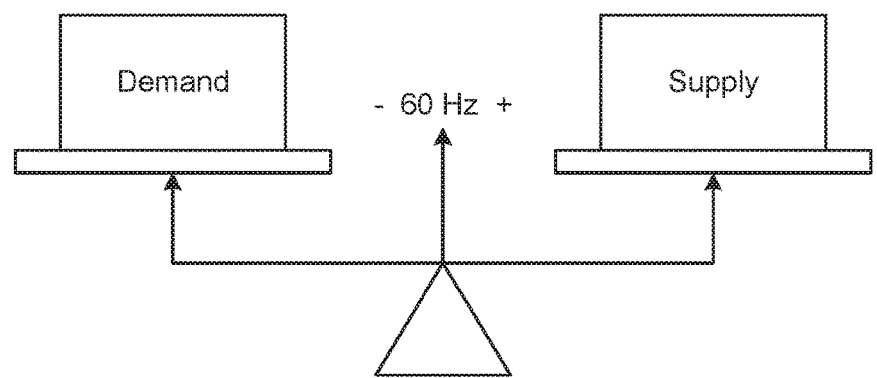
FIG. 4 is a drawing illustrating the electric supply to an energy grid and electric demand from the energy grid which must be balanced in order to maintain the grid frequency, according to an exemplary embodiment.

Referring now to FIGS. 3-4, a photovoltaic energy system 300 that uses battery storage to simultaneously perform both ramp rate control and frequency regulation is shown, according to an exemplary embodiment. Ramp rate control is the process of offsetting ramp rates (i.e., increases or decreases in the power output of an energy system such as a photovoltaic energy system) that fall outside of compliance limits determined by the electric power authority overseeing the energy grid. Ramp rate control typically requires the use of an energy source that allows for offsetting ramp rates by either supplying additional power to the grid or consuming more power from the grid. In some instances, a facility is penalized for failing to comply with ramp rate requirements.

Frequency regulation is the process of maintaining the stability of the grid frequency (e.g., 60 Hz in the United States). As shown in FIG. 4, the grid frequency may remain balanced at 60 Hz as long as there is a balance between the demand from the energy grid and the supply to the energy grid. An increase in demand yields a decrease in grid frequency, whereas an increase in supply yields an increase in grid frequency. During a fluctuation of the grid frequency, system 300 may offset the fluctuation by either drawing more energy from the energy grid (e.g., if the grid frequency is too high) or by providing energy to the energy grid (e.g., if the grid frequency is too low). Advantageously, system 300 may use battery storage in combination with photovoltaic power to perform frequency regulation while simultaneously complying with ramp rate requirements and maintaining the state-of-charge of the battery storage within a predetermined desirable range.

Referring particularly to FIG. 3, system 300 is shown to include a photovoltaic (PV) field 302, a PV field power inverter 304, a battery 306, a battery power inverter 308, a point of interconnection (POI) 310, and an energy grid 312. PV field 302 may include a collection of photovoltaic cells. The photovoltaic cells are configured to convert solar energy (i.e., sunlight) into electricity using a photovoltaic material such as monocrystalline silicon, polycrystalline silicon, amorphous silicon, cadmium telluride, copper indium gallium selenide/sulfide, or other materials that exhibit the photovoltaic effect. In some embodiments, the photovoltaic cells are contained within packaged assemblies that form solar panels. Each solar panel may include a plurality of linked photovoltaic cells. The solar panels may combine to form a photovoltaic array.

PV field 302 may have any of a variety of sizes and/or locations. In some embodiments, PV field 302 is part of a large-scale photovoltaic power station (e.g., a solar park or farm) capable of providing an energy supply to a large number of consumers. When implemented as part of a large-scale system, PV field 302 may cover multiple hectares and may have power outputs of tens or hundreds of megawatts. In other embodiments, PV field 302 may cover a smaller area and may have a relatively lesser power output (e.g., between one and ten megawatts, less than one megawatt, etc.). For example, PV field 302 may be part of a rooftop-mounted system capable of providing enough electricity to power a single home or building. It is contemplated that PV field 302 may have any size, scale, and/or power output, as may be desirable in different implementations.

PV field 302 may generate a direct current (DC) output that depends on the intensity and/or directness of the sunlight to which the solar panels are exposed. The directness of the sunlight may depend on the angle of incidence of the sunlight relative to the surfaces of the solar panels. The intensity of the sunlight may be affected by a variety of environmental factors such as the time of day (e.g., sunrises and sunsets) and weather variables such as clouds that cast shadows upon PV field 302. When PV field 302 is partially or completely covered by shadow, the power output of PV field 302 (i.e., PV field power $P_{PV}$) may drop as a result of the decrease in solar intensity.

In some embodiments, PV field 302 is configured to maximize solar energy collection. For example, PV field 302 may include a solar tracker (e.g., a GPS tracker, a sunlight sensor, etc.) that adjusts the angle of the solar panels so that the solar panels are aimed directly at the sun throughout the day. The solar tracker may allow the solar panels to receive direct sunlight for a greater portion of the day and may increase the total amount of power produced by PV field 302. In some embodiments, PV field 302 includes a collection of mirrors, lenses, or solar concentrators configured to direct and/or concentrate sunlight on the solar panels. The energy generated by PV field 302 may be stored in battery 306 or provided to energy grid 312.

Still referring to FIG. 3, system 300 is shown to include a PV field power inverter 304. Power inverter 304 may be configured to convert the DC output of PV field 302 $P_{PV}$ into an alternating current (AC) output that can be fed into energy grid 312 or used by a local (e.g., off-grid) electrical network. For example, power inverter 304 may be a solar inverter or grid-tie inverter configured to convert the DC output from PV field 302 into a sinusoidal AC output synchronized to the grid frequency of energy grid 312. In some embodiments, power inverter 304 receives a cumulative DC output from PV field 302. For example, power inverter 304 may be a string inverter or a central inverter. In other embodiments, power inverter 304 may include a collection of micro-inverters connected to each solar panel or solar cell. PV field power inverter 304 may convert the DC power output $P_{PV}$ into an AC power output $u_{PV}$ and provide the AC power output $u_{PV}$ to POI 310.

Power inverter 304 may receive the DC power output $P_{PV}$ from PV field 302 and convert the DC power output to an AC power output that can be fed into energy grid 312. Power inverter 304 may synchronize the frequency of the AC power output with that of energy grid 312 (e.g., 50 Hz or 60 Hz) using a local oscillator and may limit the voltage of the AC power output to no higher than the grid voltage. In some embodiments, power inverter 304 is a resonant inverter that includes or uses LC circuits to remove the harmonics from a simple square wave in order to achieve a sine wave matching the frequency of energy grid 312. In various embodiments, power inverter 304 may operate using high-frequency transformers, low-frequency transformers, or without transformers. Low-frequency transformers may convert the DC output from PV field 302 directly to the AC output provided to energy grid 312. High-frequency transformers may employ a multi-step process that involves converting the DC output to high-frequency AC, then back to DC, and then finally to the AC output provided to energy grid 312.

Power inverter 304 may be configured to perform maximum power point tracking and/or anti-islanding. Maximum power point tracking may allow power inverter 304 to produce the maximum possible AC power from PV field 302. For example, power inverter 304 may sample the DC power output from PV field 302 and apply a variable resistance to find the optimum maximum power point. Anti-islanding is a protection mechanism that immediately shuts down power inverter 304 (i.e., preventing power inverter 304 from generating AC power) when the connection to an electricity-consuming load no longer exists. In some embodiments, PV field power inverter 304 performs ramp rate control by limiting the power generated by PV field 302.

Still referring to FIG. 3, system 300 is shown to include a battery power inverter 308. Battery power inverter 308 may be configured to draw a DC power $P_{bat}$ from battery 306, convert the DC power $P_{bat}$ into an AC power $u_{bat}$, and provide the AC power $u_{bat}$ to POI 310. Battery power inverter 308 may also be configured to draw the AC power $u_{bat}$ from POI 310, convert the AC power $u_{bat}$ into a DC battery power $P_{bat}$, and store the DC battery power $P_{bat}$ in battery 306. The DC battery power $P_{bat}$ may be positive if battery 306 is providing power to battery power inverter 308 (i.e., if battery 306 is discharging) or negative if battery 306 is receiving power from battery power inverter 308 (i.e., if battery 306 is charging). Similarly, the AC battery power $u_{bat}$ may be positive if battery power inverter 308 is providing power to POI 310 or negative if battery power inverter 308 is receiving power from POI 310.

The AC battery power $u_{bat}$ is shown to include an amount of power used for frequency regulation (i.e., $u_{FR}$) and an amount of power used for ramp rate control (i.e., $u_{RR}$) which together form the AC battery power (i.e., $u_{bat}=u_{FR}+u_{RR}$). The DC battery power $P_{bat}$ is shown to include both $u_{FR}$ and $u_{RR}$ as well as an additional term $P_{loss}$ representing power losses in battery 306 and/or battery power inverter 308 (i.e., $P_{bat}=u_{FR}+u_{RR}+P_{loss}$). The PV field power $u_{PV}$ and the battery power $u_{bat}$ combine at POI 110 to form $P_{POI}$ (i.e., $P_{POI}=u_{PV}+u_{bat}$), which represents the amount of power provided to energy grid 312. $P_{POI}$ may be positive if POI 310 is providing power to energy grid 312 or negative if POI 310 is receiving power from energy grid 312.

Still referring to FIG. 3, system 300 is shown to include a controller 314. Controller 314 may be configured to generate a PV power setpoint $u_{PV}$ for PV field power inverter 304 and a battery power setpoint $u_{bat}$ for battery power inverter 308. Throughout this disclosure, the variable $u_{PV}$ is used to refer to both the PV power setpoint generated by controller 314 and the AC power output of PV field power inverter 304 since both quantities have the same value. Similarly, the variable $u_{bat}$ is used to refer to both the battery power setpoint generated by controller 314 and the AC power output/input of battery power inverter 308 since both quantities have the same value.

PV field power inverter 304 uses the PV power setpoint $u_{PV}$ to control an amount of the PV field power $P_{PV}$ to provide to POI 110. The magnitude of $u_{PV}$ may be the same as the magnitude of $P_{PV}$ or less than the magnitude of $P_{PV}$. For example, $u_{PV}$ may be the same as $P_{PV}$ if controller 314 determines that PV field power inverter 304 is to provide all of the photovoltaic power $P_{PV}$ to POI 310. However, $u_{PV}$ may be less than $P_{PV}$ if controller 314 determines that PV field power inverter 304 is to provide less than all of the photovoltaic power $P_{PV}$ to POI 310. For example, controller 314 may determine that it is desirable for PV field power inverter 304 to provide less than all of the photovoltaic power $P_{PV}$ to POI 310 to prevent the ramp rate from being exceeded and/or to prevent the power at POI 310 from exceeding a power limit.

Battery power inverter 308 uses the battery power setpoint $u_{bat}$ to control an amount of power charged or discharged by battery 306. The battery power setpoint $u_{bat}$ may be positive if controller 314 determines that battery power inverter 308 is to draw power from battery 306 or negative if controller 314 determines that battery power inverter 308 is to store power in battery 306. The magnitude of $u_{bat}$ controls the rate at which energy is charged or discharged by battery 306.

Controller 314 may generate $u_{PV}$ and $u_{bat}$ based on a variety of different variables including, for example, a power signal from PV field 302 (e.g., current and previous values for $P_{PV}$), the current state-of-charge (SOC) of battery 306, a maximum battery power limit, a maximum power limit at POI 310, the ramp rate limit, the grid frequency of energy grid 312, and/or other variables that can be used by controller 314 to perform ramp rate control and/or frequency regulation. Advantageously, controller 314 generates values for $u_{PV}$ and $u_{bat}$ that maintain the ramp rate of the PV power within the ramp rate compliance limit while participating in the regulation of grid frequency and maintaining the SOC of battery 306 within a predetermined desirable range. An exemplary controller which can be used as controller 314 and exemplary processes which may be performed by controller 314 to generate the PV power setpoint $u_{PV}$ and the battery power setpoint $u_{bat}$ are described in detail in U.S. Provisional Patent Application No. 62/239,245 filed Oct. 8, 2015, the entire disclosure of which is incorporated by reference herein.

Figure 5:
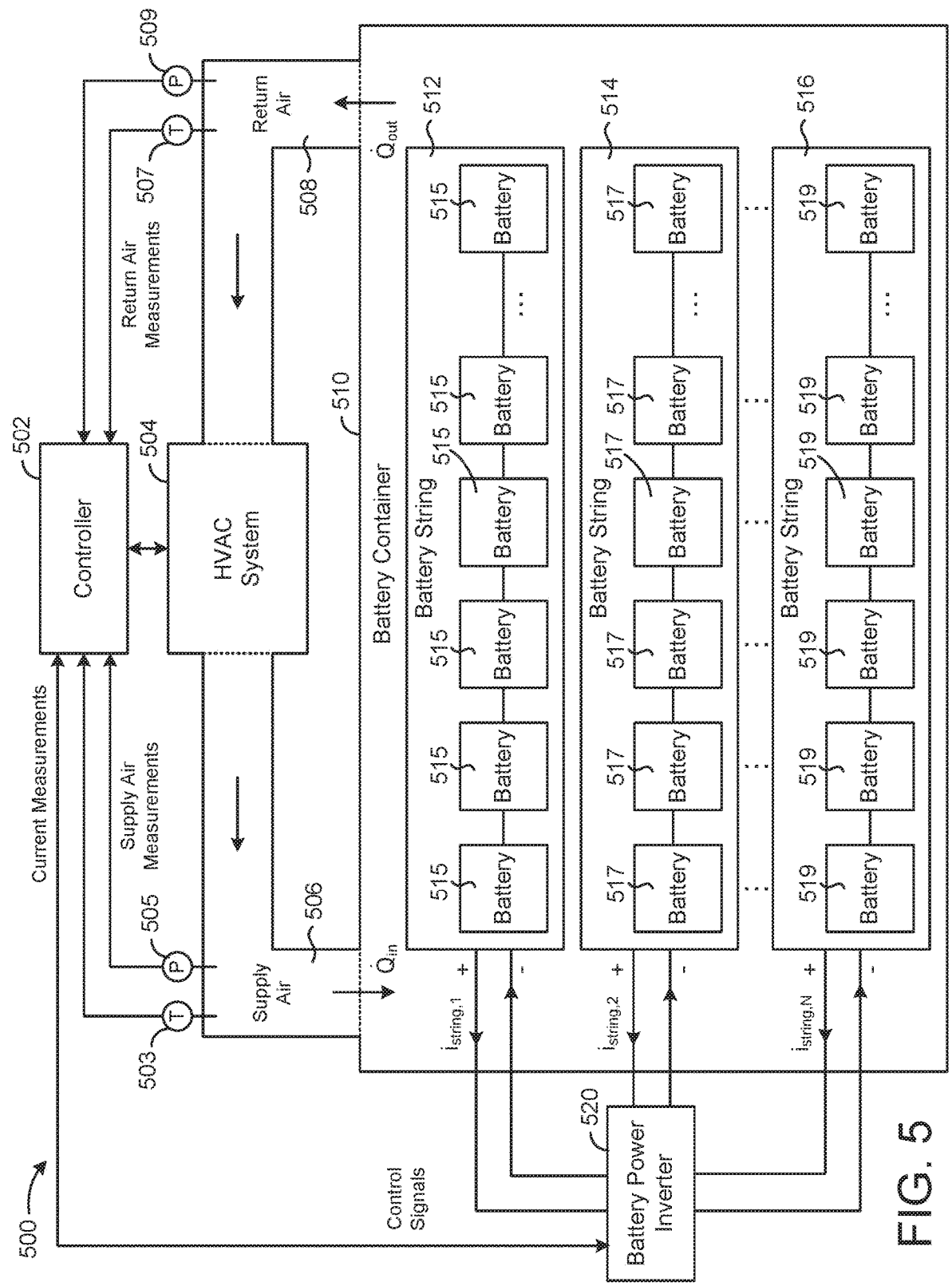
FIG. 5 is a block diagram of an electrical energy storage system which can be implemented as part of the frequency response optimization system of FIG. 1 and/or the photovoltaic energy system FIG. 3, according to an exemplary embodiment.

Electrical Energy Storage System with Battery Internal Cell Resistance Estimation Referring now to FIG. 5, an electrical energy storage system 500 is shown, according to an exemplary embodiment. System 500 can be used to monitor and control electrical energy storage in one or more batteries. System 500 can be implemented as part of a frequency response optimization system (e.g., system 100), a photovoltaic energy system (e.g., system 300), a ramp rate control system, a building management system, or any other system that stores electrical energy in batteries. Several examples of systems in which electrical energy storage system 500 can be implemented are described in detail in U.S. Provisional Patent Applications Nos. 62/239,131, 62/239,231, 62/239, 233, 62/239,245, 62/239,246, and 62/239,249. All of these applications have a filing date of Oct. 8, 2015, and are incorporated by reference herein.

Electrical energy storage system 500 is shown to include a battery container 510. Battery container 510 may be an insulated or closed container which contains one or more batteries. In some embodiments, battery container 510 contains multiple battery strings 512, 514, and 516. Although only three battery strings are shown in FIG. 5, it should be understood that battery container 510 can contain any number of battery strings. Battery strings 512-516 can be arranged in parallel with one another and connected to a battery power inverter 520.

Each battery string 512-516 can include one or more batteries 515, 517 and 519. In some embodiments, batteries 515-519 are nickel-cobalt-aluminum (NCA) lithium ion (Li-Ion) batteries. For example, batteries 515-519 can be model VL41M NCA Li-Ion batteries. Each battery 515-519 can include one or more battery cells or battery modules. Although only six batteries 515-519 are shown in each battery string 512-516, it should be understood that each battery string 512-516 can include any number of batteries 515-519. Batteries 515-519 can be connected in series with one another within each battery string 512-516 to achieve the desired voltage per battery string 512-516.

Battery power inverter 520 can be the same or similar to power inverter 106 described with reference to FIG. 1 and/or battery power inverter 308 described with reference to FIG. 3. Battery power inverter 520 can be configured to charge or discharge each battery string 512-516 by controlling the electric current of each battery string 512-516. For example, battery power inverter 520 can draw power from battery string 512 by drawing a DC current $i_{string,1}$ from the positive terminal of battery string 512, and can store power in battery string 512 by causing the DC current $i_{string,1}$ to flow into the positive terminal of battery string 512.

Similarly, battery power inverter 520 can draw power from battery string 514 by drawing a DC current $i_{string,2}$ from the positive terminal of battery string 514, and can store power in battery string 514 by causing the DC current $i_{string,2}$ to flow into the positive terminal of battery string 514. Battery power inverter 520 can draw power from battery string 516 by drawing a DC current $i_{string,N}$ from the positive terminal of battery string 516, and can store power in battery string 516 by causing the DC current $i_{string,N}$ to flow into the positive terminal of battery string 516. Battery power inverter 520 can be configured to control and/or measure the magnitude of the DC currents through each battery string 512-516.

Still referring to FIG. 5, electrical energy storage system 500 is shown to include a heating, ventilation, and air conditioning (HVAC) system 504. HVAC system 504 can be configured to monitor and control the environment (e.g., temperature, humidity, etc.) within battery container 510. For example, HVAC system 504 can provide cooling or heating to battery container 510 to maintain battery container 510 at a temperature setpoint or within a temperature range. In various embodiments, HVAC system 504 can be configured to provide cooling or heating for only battery container 510, or for multiple building zones or spaces including battery container 510.

HVAC system 504 can include any of a variety of HVAC equipment (e.g., chillers, heat recovery chillers, air handling units, cooling towers, pumps, etc.) configured to add or remove heat from an airflow provided to battery container 510. HVAC system 504 can include airflow devices (e.g., fans, ducts, vents, dampers, actuators, variable air volume units, etc.) configured to provide airflow through battery container 510. HVAC system 504 can include sensors (e.g., temperature sensors, pressure sensors, humidity sensors, airflow sensors, oxygen sensors, etc.) configured to measure various attributes of supply air 506 provided to battery container 510 and/or return air 508 received from battery container 510.

In some embodiments, HVAC system 504 includes a temperature sensor 503 configured to measure the temperature of supply air 506 and a pressure sensor 505 configured to measure the dynamic pressure of supply air 506. Sensors 503 and 505 can provide supply air measurements to controller 502. The dynamic pressure measured by pressure sensor 505 can be used by controller 502 to determine the flow velocity and/or flow rate of supply air 506. Similarly, HVAC system 504 can include a temperature sensor 507 configured to measure the temperature of return air 508 and a pressure sensor 509 configured to measure the dynamic pressure of return air 508. Sensors 507 and 509 can provide return air measurements to controller 502. The dynamic pressure measured by pressure sensor 507 can be used by controller 502 to determine the flow velocity and/or flow rate of return air 508.

Still referring to FIG. 5, electrical energy storage system 500 is shown to include a controller 502. Controller 502 can be configured to monitor and control system 500. For example, controller 502 can receive input from sensors 503-509 and current measurements from battery power inverter 520. Controller 502 and can provide control signals to battery power inverter 520 and to HVAC system 504. Controller 502 can operate battery power inverter 520 to control the rate at which electrical energy is stored or discharged from each of battery strings 512-516. Controller 520 can be configured to perform any of the functions described in U.S. Provisional Patent Applications Nos. 62/239,131, 62/239,231, 62/239,233, 62/239,245, 62/239,246, and 62/239,249. For example, controller 502 can operate battery power inverter 520 to perform frequency regulation, ramp rate control, electric load shifting, or any other activity which uses electrical energy storage.

Controller 502 can use temperature and airflow measurements from sensors 503-509 to determine the rate of heat generation by battery strings 512-516. For example, controller 502 can use the measurements provided by sensors 503-505 to calculate the heat transfer $\dot{Q}_{in}$ into battery container 510 via supply air 506. Similarly, controller 502 can use the measurements provided by sensors 507-509 to calculate the heat transfer $\dot{Q}_{out}$ out of battery container 510 via return air 508. In some embodiments, the battery container 510 is insulated such that the only heat transfer into or out of battery container 510 is via the supply air 506 and return air 508. Accordingly, controller 502 can calculate the battery heat generation $\dot{Q}_{bat}$ as the difference between $\dot{Q}_{out}$ and $\dot{Q}_{in}$ (e.g., $\dot{Q}_{bat}=\dot{Q}_{out}-\dot{Q}_{in}$).

Controller 502 can use the battery heat generation $\dot{Q}_{bat}$ to estimate the battery cell resistance $R_{cell}$. In some embodiments, controller 502 models the battery heat generation using the following equation:

$$\dot{Q}_{bat}=i^2 R_{cell}$$

where i is the total electric current through battery strings 512-516, and $R_{cell}$ is the composite battery cell resistance. Controller 502 can use battery current measurements from battery power inverter 520 in combination with the estimated battery heat generation $\dot{Q}_{bat}$ to calculate the battery cell resistance $R_{cell}$.

Controller 502 can use the battery cell resistance $R_{cell}$ to predict or estimate battery operating parameters (e.g., maximum state of charge, maximum charging or discharging power, etc.). Controller 502 can use the battery operating parameters to determine optimal power setpoints for power inverter 520. Controller 502 can use the battery cell resistance $R_{cell}$ in a battery life model as an indicator of remaining battery life. In some embodiments, controller 502 uses the battery cell resistance $R_{cell}$ to detect faults in electrical energy storage system 500. For example, controller 502 can monitor the battery cell resistance $R_{cell}$ over time and compare the battery cell resistance $R_{cell}$ to a threshold value. Controller 502 can output a fault indication in response to a determination that the battery cell resistance $R_{cell}$ has crossed the threshold value. Controller 502 can use a history of values of the battery cell resistance $R_{cell}$ to generate a function or model (e.g., a battery degradation model) which predicts future values of the battery cell resistance $R_{cell}$ and/or battery health. Controller 502 can use the battery degradation model to predict future battery faults and project battery health into the future. These and other features of controller 502 are described in greater detail below.

Controller

Figure 6:
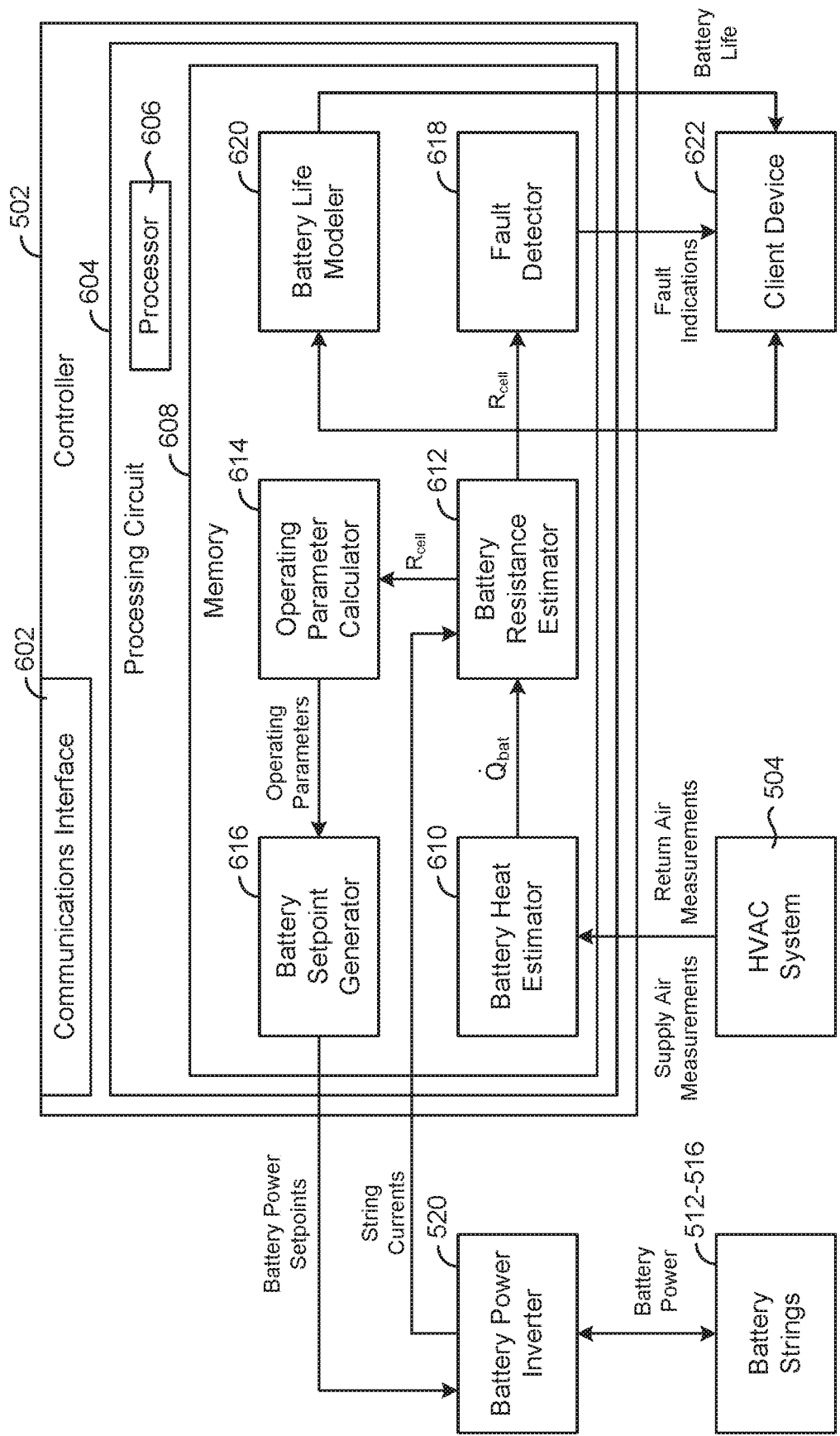
FIG. 6 is a block diagram illustrating a controller which can be used to control the electrical energy storage system of FIG. 5, according to an exemplary embodiment.

Referring now to FIG. 6, a block diagram illustrating controller 502 in greater detail is shown, according to an exemplary embodiment. Controller 502 is shown to include a communications interface 602 and a processing circuit 604. Communications interface 602 may include wired or wireless interfaces (e.g., jacks, antennas, transmitters, receivers, transceivers, wire terminals, etc.) for conducting data communications with various systems, devices, or networks. For example, communications interface 602 may include an Ethernet card and port for sending and receiving data via an Ethernet-based communications network and/or a WiFi transceiver for communicating via a wireless communications network. Communications interface 602 may be configured to communicate via local area networks or wide area networks (e.g., the Internet, a building WAN, etc.) and may use a variety of communications protocols (e.g., BACnet, IP, LON, etc.).

Communications interface 602 may be a network interface configured to facilitate electronic data communications between controller 502 and various external systems or devices (e.g., campus 102, energy grid 104, battery power inverter 520, incentive provider 114, HVAC system 504, client device 622, etc.). For example, controller 502 can receive supply air measurements and return air measurements from HVAC system 504 via communications interface 602. Controller 502 can receive measurements of the battery string electric currents from battery power inverter 520 and provide battery power setpoints to battery power inverter 520 via communications interface 602. Controller 502 can provide fault indications and battery life indications to client device 622 via communications interface 602.

Processing circuit 604 is shown to include a processor 606 and memory 608. Processor 606 may be a general purpose or specific purpose processor, an application specific integrated circuit (ASIC), one or more field programmable gate arrays (FPGAs), a group of processing components, or other suitable processing components. Processor 606 may be configured to execute computer code or instructions stored in memory 608 or received from other computer readable media (e.g., CDROM, network storage, a remote server, etc.).

Memory 608 may include one or more devices (e.g., memory units, memory devices, storage devices, etc.) for storing data and/or computer code for completing and/or facilitating the various processes described in the present disclosure. Memory 608 may include random access memory (RAM), read-only memory (ROM), hard drive storage, temporary storage, non-volatile memory, flash memory, optical memory, or any other suitable memory for storing software objects and/or computer instructions. Memory 608 may include database components, object code components, script components, or any other type of information structure for supporting the various activities and information structures described in the present disclosure. Memory 608 may be communicably connected to processor 606 via processing circuit 604 and may include computer code for executing (e.g., by processor 606) one or more processes described herein.

Still referring to FIG. 6, controller 502 is shown to include a battery heat estimator 610. Battery heat estimator 610 is configured to estimate the heat generation $\dot{Q}_{bat}$ of battery strings 512-516. In some embodiments, battery heat estimator 610 estimates the battery heat generation $\dot{Q}_{bat}$ as a function of the supply air measurements, return air measurements, and battery string currents. For example, battery heat estimator 610 can use the supply air measurements and return air measurements to calculate a rate of heat flow $\dot{Q}_{in}$ into battery container 510 and a rate of heat flow $\dot{Q}_{out}$ out of battery container 510.

In some embodiments, battery heat estimator 610 calculates the heat flow $\dot{Q}_{in}$ into battery container 510 using the following equation:

$$\dot{Q}_{in} = T_{in} C_{in} \dot{V}_{in} \rho_{in}$$

where $T_{in}$ is the temperature of the supply air 506, $C_{in}$ is the heat capacity of the supply air 506, $\dot{V}_{in}$ is the volumetric flow rate of the supply air 506, and $\rho_{in}$ is the density of the supply air 506. $T_{in}$ can be measured directly (e.g., by temperature sensor 503), whereas $\dot{V}_{in}$ can be calculated based on the measured flow velocity $v_{in}$ of the supply air 506 (measured by sensor 505) and the cross-sectional area $A_{in}$ of the supply air duct (e.g., $\dot{V}_{in} = v_{in} * A_{in}$). The supply air heat capacity $C_{in}$ and density $\rho_{in}$ can be stored as constants or calculated based on the measured temperature and pressure of the supply air 506.

In some embodiments, battery heat estimator 610 calculates the heat flow $\dot{Q}_{out}$ out of battery container 510 using the following equation:

$$\dot{Q}_{out} = T_{out} C_{out} \dot{V}_{out} \rho_{out}$$

where $T_{out}$ is the temperature of the return air 508, $C_{out}$ is the heat capacity of the return air 508, $\dot{V}_{out}$ is the volumetic flow rate of the return air 508, and $\rho_{out}$ is the density of the return air 508. $T_{out}$ can be measured directly (e.g., by temperature sensor 507), whereas $\dot{V}_{out}$ can be calculated based on the measured flow velocity $v_{out}$ of the return air 508 (measured by sensor 509) and the cross-sectional area $A_{out}$ of the return air duct (e.g., $\dot{V}_{out} = v_{out} * A_{out}$). The return air heat capacity $C_{out}$ and density $\rho_{out}$ can be stored as constants or calculated based on the measured temperature and pressure of the return air 508.

Battery heat estimator 610 can use the heat flow $\dot{Q}_{in}$ into battery container 510 heat flow $\dot{Q}_{out}$ out of battery container 510 to estimate the heat generation $\dot{Q}_{bat}$ of battery strings 512-516. In some embodiments, battery heat estimator 610 estimates $\dot{Q}_{bat}$ using the following equation:

$$\dot{Q}_{bat} = \dot{Q}_{out} - \dot{Q}_{in}$$

where $\dot{Q}_{bat}$ is defined as the difference between the heat flow $\dot{Q}_{out}$ out of battery container 510 and the heat flow $\dot{Q}_{in}$ into battery container 510. Battery heat estimator 610 can model battery container 510 as an insulated control volume such that the only heat transfer into battery container 510 and out of battery container 510 is via the supply air 506 and the return air 508.

In some embodiments, battery heat estimator 610 can account for heat transfer through the walls of battery container 510 when estimating the battery heat generation $\dot{Q}_{bat}$. For example, battery heat estimator 610 can model the walls of battery container 510 as a thermal resistor between the internal volume of battery container 510 and the ambient environment outside battery container 510. Battery heat estimator 610 can generate a battery heat model which accounts for heat transfer through the walls of battery container 510, as shown in the following equation:

$$\dot{Q}_{bat} = \dot{Q}_{out} - \dot{Q}_{in} - \dot{Q}_{walls}$$

where $\dot{Q}_{walls}$ represents the heat transfer into battery container 510 from the ambient environment. Battery heat estimator 610 can calculate $\dot{Q}_{walls}$ as a function of the internal temperature of battery container 510 and the ambient temperature outside battery container 510. It is contemplated that battery heat estimator 610 can generate and use any of a variety of battery heat models which account for various sources of heat flow into or out of battery container 510 (e.g., HVAC heat transfer, heat generation by electronics within battery container 510, heat transfer through the walls of battery container 510, etc.).

Still referring to FIG. 6, controller 502 is shown to include a battery resistance estimator 612. Battery resistance estimator 612 is configured to estimate the internal cell resistance $R_{cell}$ of batteries 515-519 and/or battery strings 512-516. In some embodiments, $R_{cell}$ is a composite resistance of the entire set of batteries 515-519 within battery container 510, denoted herein as $\hat{R}_{cell,comp}$. In other embodiments $R_{cell}$ can include a cell resistance of one or more battery strings 512-516 (e.g., $R_{cell,string,1}$, $R_{cell,string,2}$, etc.) and/or a cell resistance of one or more individual batteries 515-519 (e.g., $R_{cell,bat,1}$, $R_{cell,bat,2}$, etc.).

Battery resistance estimator 612 can estimate the composite battery resistance $\hat{R}_{cell,comp}$ as a function of the battery heat generation $\dot{Q}_{bat}$ and the electric currents provided to each of battery strings 512-516 (i.e., $I_{string,1}$, $I_{string,2}$, ... $I_{string,N}$). For example, battery resistance estimator 612 can estimate the composite battery resistance $\hat{R}_{cell,comp}$ using the following equation:

$$\hat{R}_{cell,comp} \approx \frac{\dot{Q}_{bat}}{\sum I_{strings}^2}$$

where $\Sigma I_{strings}^2$ is the sum of the squares of the electric currents provided to battery strings 512-516 and $\dot{Q}_{bat}$ is the battery heat generation provided by battery heat estimator 610. The term $\Sigma I_{strings}^2$ can be defined as $\Sigma_{i=1}^{N} I_{string,i}^2$, where N is the total number of battery strings 512-516. Battery resistance estimator 612 can receive measurements or estimates of the battery string currents from battery power inverter 520 or from electric current sensors configured to measure the electric current of each battery string 512-516.

In some embodiments, battery resistance estimator 612 compensates for internal energy changes within battery container 510 that can cause the frequency response of the battery heat generation $\dot{Q}_{bat}$ to be different from that of $\Sigma I_{strings}^2$. For example, thermal energy stored in the solid mass of the battery racks (e.g., steel modules), within batteries 515-519, and/or the air within battery container 510 can cause $\dot{Q}_{bat}$ to be time shifted relative to $\Sigma I_{strings}^2$ or have a different frequency response than $\Sigma I_{strings}^2$. Battery resistance estimator 612 can compensate for such factors by integrating both terms over a suitable time horizon, as shown in the following equation:

$$\hat{R}_{cell,comp} \approx \frac{\int_0^H \dot{Q}_{bat}(t)dt}{\int_0^H \Sigma I_{strings}^2(t)dt}$$

where H defines the duration of the time horizon over which $\dot{Q}_{bat}(t)$ and $\Sigma I_{strings}^2(t)$ are integrated (e.g., one hour, one day, etc.). In some embodiments, battery resistance estimator 612 calculates the duration of the time horizon H as a function of the frequency responses of $\dot{Q}_{bat}$ and $\Sigma I_{strings}^2$ (e.g., $H = f(\omega_{bat}, \omega_{strings})$).

Battery resistance estimator 612 can collect multiple samples of $\dot{Q}_{bat}(t)$ and $\Sigma I_{strings}^2(t)$ over the time horizon and can use the collected samples to calculate the integrated values. In some embodiments, battery resistance estimator 612 uses average values of $\dot{Q}_{bat}(t)$ and $\Sigma I_{strings}^2(t)$ instead of integrated values to calculate $\hat{R}_{cell,comp}$. Advantageously, the use of integrated or average values compensates for internal energy changes as described above. The use of integrated or average values also attenuates measurement noise on the composite cell resistance estimate $\hat{R}_{cell,comp}$ (e.g., noise in measuring the string currents, noise in measuring the temperature/pressure of the supply air 506 and return air 508, etc.).

In some embodiments, battery resistance estimator 612 uses the estimated composite cell resistance $\hat{R}_{cell,comp}$ to calculate the cell resistance of each battery string 512-516 and/or the cell resistance of each individual battery. For example, if the battery strings 512-516 are arranged in parallel, the composite cell resistance $\hat{R}_{cell,comp}$ can be expressed as a function of the individual string resistances $\hat{R}_{string,i}$ as shown in the following equation:

$$\frac{1}{\hat{R}_{cell,comp}} = \frac{1}{\hat{R}_{cell,string,1}} + \frac{1}{\hat{R}_{cell,string,2}} + \ldots + \frac{1}{\hat{R}_{cell,string,N}}$$

Battery resistance estimator 612 can calculate the individual resistance of each battery string 512-516 based on the assumption that each string resistance is approximately equal (i.e., $\hat{R}_{string,1} \approx \hat{R}_{string,2} \approx \hat{R}_{string,N}$).

If each string contains multiple batteries in series, battery resistance estimator 612 can calculate the resistance of each battery in a given string (e.g., $\hat{R}_{cell,bat,1}$, $\hat{R}_{cell,bat,2}$, etc.) by dividing the string resistance $\hat{R}_{cell,string,i}$ by the total number of batteries in the string. For example, battery resistance estimator 612 can calculate the cell resistance of battery j using the following equation:

$$\hat{R}_{cell,bat,j} = \frac{\hat{R}_{cell,string,i}}{M}$$

where battery j is an individual battery located in battery string i and M is the total number of batteries in battery string i.

Still referring to FIG. 6, controller 502 is shown to include an operating parameter calculator 614. Operating parameter calculator 614 is configured to calculate one or more operating parameters of electrical energy storage system 500. In some embodiments, operating parameter calculator 614 calculates the operating parameters as a function of the battery cell resistance $R_{cell}$. Operating parameter calculator 614 can receive the battery cell resistance $R_{cell}$ from battery resistance estimator 612. As discussed above, the battery cell resistance $R_{cell}$ can include the estimated composite battery cell resistance $\hat{R}_{cell,comp}$, one or more estimated battery string resistances $\hat{R}_{cell,string,i}$, and/or one or more estimated individual battery resistances $\hat{R}_{cell,bat,j}$.

Operating parameter calculator 614 can use the battery cell resistance $R_{cell}$ to calculate battery parameters such as maximum state of charge (i.e., the maximum charge the battery can hold), maximum charging/discharging power (i.e., the rate at which the battery can be charged or discharged), power storage efficiency, battery efficiency, battery health, etc. Although only a few operating parameters are described herein, it is contemplated that the battery cell resistance $R_{cell}$ can be used to determine any of a variety of parameters that characterize the performance of electrical energy storage system 500 and/or batteries 515-519. Operating parameter calculator 614 can provide the operating parameters to battery setpoint generator 616.

Battery setpoint generator 616 can use the operating parameters to generate battery power setpoints. The battery power setpoints can be provided to battery power inverter 520 to control the amount of electrical energy stored or discharged from batteries 515-519. In some embodiments, battery setpoint generator 616 determines optimal battery power setpoints in order to comply with ramp rate requirements, regulate the frequency of an energy grid, participate in incentive-based frequency regulation programs, provide electricity to a building or campus, perform load shifting, or otherwise use batteries 515-519 to optimize the operation of the electrical energy storage system 500. Several examples of optimization techniques which can be used by battery setpoint generator 616 to generate battery power setpoints are described in detail in U.S. Provisional Patent Applications Nos. 62/239,131, 62/239,231, 62/239,233, 62/239,245, 62/239,246, and 62/239,249.

Still referring to FIG. 6, controller 502 is shown to include a fault detector 618. Fault detector 618 can use the battery cell resistance $R_{cell}$ to detect faults in electrical energy storage system 500. For example, fault detector 618 can monitor the battery cell resistance $R_{cell}$ over time and compare the battery cell resistance $R_{cell}$ to a threshold value. Fault detector 618 can output a fault indication in response to a determination that the battery cell resistance $R_{cell}$ has crossed the threshold value (e.g., increases above the threshold value or drops below the threshold value). Fault detector 618 can provide fault indications to client device 622.

In some embodiments, fault detector 618 uses a history of values of the battery cell resistance $R_{cell}$ to generate a function or model which predicts future values of the battery cell resistance $R_{cell}$. For example, fault detector 618 can extrapolate a series values of $R_{cell}$ into the future to estimate future values of the battery cell resistance $R_{cell}$. Fault detector 618 can predict when a battery fault will occur based on the extrapolated values of $R_{cell}$. For example, fault detector 618 can use the extrapolated values of the battery cell resistance $R_{cell}$ to determine when the battery cell resistance $R_{cell}$ will reach a threshold value. Fault detector 618 can predict that the battery fault will occur at a time when the battery cell resistance $R_{cell}$ is estimated to reach the threshold value.

In some embodiments, fault detector 618 uses multiple different values of $R_{cell}$ to perform alarming and fault detection functions. For example, battery resistance estimator 612 can provide fault detector 618 with instantaneous values of $R_{cell}$ for use in alarming. The instantaneous values of $R_{cell}$ can be based on a single value of (bat and/or a single measurement of the string currents $I_{strings}$. Battery resistance estimator 612 can use a relatively short integration interval (e.g., a minute, fifteen minutes, an hour, etc.) to calculate short-term values of $R_{cell}$ and a relatively long integration interval (e.g., several hours, a day, etc.) to calculate long-term values of $R_{cell}$. The short-term values of $R_{cell}$ may be less accurate than the long-term values, but can provide fault detector 618 with information more quickly for time-sensitive implementations such as alarming. The long-term values of $R_{cell}$ may be more accurate than the short-term values and can be used for implementations that do not require contemporaneous data (e.g., fault prediction, diagnostics, etc.).

Still referring to FIG. 6, controller 502 is shown to include a battery life modeler 620. Battery life modeler 620 can use the battery cell resistance $R_{cell}$ to estimate the remaining life of the batteries 515-519. In some embodiments, battery life modeler 620 estimates remaining battery life using a battery life model. The battery life model can define remaining battery life as a function of the battery cell resistance $R_{cell}$ provided by battery resistance estimator 612 and/or the operating parameters provided by operating parameter calculator 614. One example of such a battery life model is shown in the following equation:

$$BatteryLife = f\left(R_{cell}DOD, SOC, \sum kW_{battery,} \sum \frac{dkW_{battery}}{dt}\right)$$

where BatteryLife is the estimated remaining battery life, $R_{cell}$ is the battery cell resistance, DOD is the typical (e.g., average) depth of discharge of the battery during use, SOC is the typical (e.g., average) state-of-charge of the battery, $kW_{battery}$ is the battery power setpoint, and $$\frac{dkW_{battery}}{dt}$$

is the rate of change of the battery power setpoint.

Some of the variables in the battery life model can be based on the battery power setpoints provided by battery setpoint generator 616 and/or other control decisions made by controller 502. Other variables in the battery life model can be based on the estimated cell resistance $R_{cell}$ and/or other battery attributes or parameters. Several examples of battery life models which can be used by battery life modeler 620 are described in detail in U.S. Provisional Patent Applications Nos. 62/239,131 and 62/239,246. Battery life modeler 620 can provide the remaining battery life to client device 622.

Flow Diagrams

Referring now to FIG. 7, a flow diagram illustrating a process 700 for estimating battery cell resistance is shown, according to an exemplary embodiment. Process 700 can be performed by one or more components of electrical energy storage system 500 (e.g., controller 502). Process 700 is shown to include measuring attributes of airflow into a battery container and airflow out of the battery container (step 702). In some embodiments, the airflow into the battery container is provided as supply air from a HVAC system (e.g., supply air 506) and the airflow out of the battery container is provided as return air to the HVAC system (e.g., return air 508). The measured attributes can include, for example, temperature, humidity, pressure, oxygen content, flow velocity, etc.

Process 700 is shown to include calculating battery heat generation based on the airflow measurements (step 704). In some embodiments, step 704 is performed by battery heat estimator 610, as described with reference to FIG. 6. Step 704 can include using the supply air measurements and return air measurements to calculate a rate of heat flow $\dot{Q}_{in}$ into the battery container and a rate of heat flow $\dot{Q}_{out}$ out of the battery container. The heat flow $\dot{Q}_{in}$ into the battery container and the heat flow $\dot{Q}_{out}$ out of the battery container can be used to estimate the heat generation $\dot{Q}_{bat}$ of the battery using the following equation:

$$\dot{Q}_{bat} = \dot{Q}_{out} - \dot{Q}_{in}$$

where $\dot{Q}_{bat}$ is defined as the difference between the heat flow $\dot{Q}_{out}$ out of the battery container and the heat flow $\dot{Q}_{in}$ into the battery container.

In some embodiments, step 704 includes accounting for heat transfer through the walls of the battery container when estimating the battery heat generation $\dot{Q}_{bat}$. For example, step 704 can include modeling the walls of the battery container as a thermal resistor between the internal volume of the battery container and the ambient environment outside the battery container. Step 704 can include generating a battery heat model which accounts for heat transfer through the walls of the battery container, as shown in the following equation:

$$\dot{Q}_{bat} = \dot{Q}_{out} - \dot{Q}_{in} - \dot{Q}_{walls}$$

where $\dot{Q}_{walls}$ represents the heat transfer into the battery container from the ambient environment.

Process 700 is shown to include measuring electric current provided to one or more batteries in the battery container (step 706) and estimating battery cell resistance based on the battery heat generation and the electric current (step 708). Step 706 can include receiving measurements or estimates of one or more battery string currents from a battery power inverter or from electric current sensors configured to measure the electric current of each battery string. In some embodiments, the battery cell resistance $R_{cell}$ estimated in step 708 is a composite resistance of an entire set of batteries within the battery container, denoted herein as $\hat{R}_{cell,comp}$. In other embodiments $R_{cell}$ can include a cell resistance of one or more battery strings (e.g., $R_{cell,string,1}$, $R_{cell,string,2}$, etc.) and/or a cell resistance of one or more individual batteries (e.g., $R_{cell,bat,1}$, $R_{cell,bat,2}$, etc.).

Step 708 can include estimating the composite battery resistance $\hat{R}_{cell,comp}$ as a function of the battery heat generation $\dot{Q}_{bat}$ and the electric currents provided to each of battery strings (i.e., $I_{string,1}$, $I_{string,2}$, ... $I_{string,N}$). For example, step 708 can include estimating the composite battery resistance $\hat{R}_{cell,comp}$ using the following equation:

$$\hat{R}_{cell,comp} \approx \frac{\dot{Q}_{bat}}{\sum I_{strings}^2}$$

where $\Sigma I_{strings}^2$ is the sum of the squares of the electric currents provided to the battery strings and $\dot{Q}_{bat}$ is the battery heat generation estimated in step 704. The term strings can be defined as $\Sigma = \sum_{i=1}^{N} I_{string,i}^2$, where N is the total number of battery strings.

In some embodiments, step 708 includes compensating for internal energy changes within the battery container that can cause the frequency response of the battery heat generation $\dot{Q}_{bat}$ to be different from that of $\Sigma I_{strings}^2$. For example, thermal energy stored in the solid mass of the battery racks (e.g., steel modules), within batteries, and/or the air within the battery container can cause $\dot{Q}_{bat}$ to be time shifted relative to $\Sigma I_{strings}^2$ or have a different frequency response than $\Sigma I_{strings}^2$. Step 708 can include compensating for such factors by integrating both terms over a suitable time horizon, as shown in the following equation:

$$\hat{R}_{cell,comp} \approx \frac{\int_0^H \dot{Q}_{bat}(t)dt}{\int_0^H \Sigma I_{strings}^2(t)dt}$$

where H defines the duration of the time horizon over which $\dot{Q}_{bat}(t)$ and $\Sigma I_{strings}^2(t)$ are integrated (e.g., one hour, one day, etc.). In some embodiments step 708 includes calculating the duration of the time horizon H as a function of the frequency responses of $\dot{Q}_{bat}$ and $\Sigma I_{strings}^2$ (e.g., $H = f(\omega_{bat}, \omega_{strings})$).

Step 708 can include collecting multiple samples of $\dot{Q}_{bat}(t)$ and $\Sigma I_{strings}^2(t)$ over the time horizon and can use the collected samples to calculate the integrated values. In some embodiments, step 708 includes using average values of $\dot{Q}_{bat}(t)$ and $\Sigma I_{strings}^2(t)$ instead of integrated values to calculate $\hat{R}_{cell,comp}$. Advantageously, the use of integrated or average values compensates for internal energy changes as described above. The use of integrated or average values also attenuates measurement noise on the composite cell resistance estimate $\hat{R}_{cell,comp}$ (e.g., noise in measuring the string currents, noise in measuring the temperature/pressure of the supply air and return air, etc.).

In some embodiments, step 708 includes using the estimated composite cell resistance $\hat{R}_{cell,comp}$ to calculate the cell resistance of each battery string and/or the cell resistance of each individual battery. For example, if the battery strings are arranged in parallel, the composite cell resistance $\hat{R}_{cell,comp}$ can be expressed as a function of the individual string resistances $\hat{R}_{string,i}$ as shown in the following equation:

$$\frac{1}{\hat{R}_{cell,comp}} = \frac{1}{\hat{R}_{cell,string,1}} + \frac{1}{\hat{R}_{cell,string,2}} + \ldots + \frac{1}{\hat{R}_{cell,string,N}}$$

In some embodiments, step 708 includes calculating the individual resistance of each battery string 512-516 based on the assumption that each string resistance is approximately equal (i.e., $\hat{R}_{string,1} \approx \hat{R}_{string,2} \approx \hat{R}_{string,N}$).

If each string contains multiple batteries in series, step 708 can include calculating the resistance of each battery in a given string (e.g., $\hat{R}_{cell,bat,1}$, $\hat{R}_{cell,bat,2}$, etc.) by dividing the string resistance $\hat{R}_{cell,string,i}$ by the total number of batteries in the string. For example, step 708 can include calculating the cell resistance of battery j using the following equation:

$$\hat{R}_{cell,bat,j} = \frac{\hat{R}_{cell,string,i}}{M}$$

where battery j is an individual battery located in battery string i and M is the total number of batteries in battery string i.

Referring now to FIG. 8, a flow diagram illustrating a process 800 for using battery cell resistance to operate an electrical energy storage system is shown, according to an exemplary embodiment. Process 800 can be performed by one or more components of electrical energy storage system 500 (e.g., controller 502). Process 800 is shown to include estimating battery cell resistance (step 802). Step 802 can be accomplished by performing process 700, as described with reference to FIG. 7.

Process 800 is shown to include predicting battery operating parameters using the estimated battery cell resistance (step 804). In some embodiments, step 804 is performed by operating parameter calculator 614, as described with reference to FIG. 6. Step 804 can include using the battery cell resistance $R_{cell}$ to calculate battery parameters such as maximum state of charge (i.e., the maximum charge the battery can hold), charging/discharging power (i.e., the rate at which the battery can be charged or discharged), power storage efficiency, etc. Although only a few operating parameters are described herein, it is contemplated that the battery cell resistance $R_{cell}$ can be used to determine any of a variety of parameters that characterize the performance of the electrical energy storage system 500 and/or the batteries.

In some embodiments, step 804 includes using the battery cell resistance $R_{cell}$ to estimate the remaining life of the batteries. Remaining battery life can be estimated using a battery life model. The battery life model can define remaining battery life as a function of the battery cell resistance $R_{cell}$ determined in step 802 and/or the operating parameters determined in step 804. One example of such a battery life model is shown in the following equation:

$$BatteryLife = f\left(R_{cell}, DOD, SOC, \sum kW_{battery}, \sum \frac{dkW_{battery}}{dt}\right)$$

where BatteryLife is the estimated remaining battery life, $R_{cell}$ is the battery cell resistance, DOD is the typical (e.g., average) depth of discharge of the battery during use, SOC is the typical (e.g., average) state-of-charge of the battery, $kW_{battery}$ is the battery power setpoint, and $$\frac{dkW_{battery}}{dt}$$

is the rate of change of the battery power setpoint.

Some of the variables in the battery life model can be based on battery power setpoints and/or other control decisions made by the controller. Other variables in the battery life model can be based on the estimated cell resistance $R_{cell}$ and/or other battery attributes or parameters. Several examples of battery life models which can be used in step 804 are described in detail in U.S. Provisional Patent Applications Nos. 62/239,131 and 62/239,246. Battery life modeler 620 can provide the remaining battery life to client device 622.

Process 800 is shown to include using the battery operating parameters to determine battery power setpoints (step 806). In some embodiments, step 806 is performed by battery setpoint generator 616, as described with reference to FIG. 6. The battery power setpoints can be provided to a battery power inverter to control the amount of electrical energy stored or discharged from the batteries. In some embodiments, step 804 includes determining optimal battery power setpoints in order to comply with ramp rate requirements, regulate the frequency of an energy grid, participate in incentive-based frequency regulation programs, provide electricity to a building or campus, perform load shifting, or otherwise use the batteries to optimize the operation of the electrical energy storage system. Several examples of optimization techniques which can be used in step 806 to generate battery power setpoints are described in detail in U.S. Provisional Patent Applications Nos. 62/239,131, 62/239,231, 62/239,233, 62/239,245, 62/239,246, and 62/239,249.

Process 800 is shown to include detecting battery faults based on the estimated battery cell resistance (step 808). In some embodiments, step 808 is performed by fault detector 618, as described with reference to FIG. 6. Step 808 can include monitoring the battery cell resistance $R_{cell}$ over time and comparing the battery cell resistance $R_{cell}$ to a threshold value. Step 808 can include outputting a fault indication in response to a determination that the battery cell resistance $R_{cell}$ has crossed the threshold value (e.g., increases above the threshold value or drops below the threshold value).

In some embodiments, step 808 includes a history of values of the battery cell resistance $R_{cell}$ to generate a function or model which predicts future values of the battery cell resistance $R_{cell}$. For example, step 808 can include extrapolating a series values of $R_{cell}$ into the future to estimate future values of the battery cell resistance $R_{cell}$. Step 808 can include predicting when a battery fault will occur based on the extrapolated values of $R_{cell}$. For example, step 808 can include using the extrapolated values of the battery cell resistance $R_{cell}$ to determine when the battery cell resistance $R_{cell}$ will reach a threshold value. Step 808 can include predicting that the battery fault will occur at a time when the battery cell resistance $R_{cell}$ is estimated to reach the threshold value.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. An electrical energy storage system comprising:
a battery container;
a plurality of battery cells within the battery container, the plurality of battery cells configured to store electrical energy;
a temperature sensor configured to measure a temperature associated with the battery container;
an electric current sensor configured to measure an electric current provided to the plurality of battery cells; and
a controller including a computer readable medium and a processor, the controller including computer executable instructions stored in the computer readable medium to:
receive a temperature signal from the temperature sensor,
receive an electric current signal from the electric current sensor;
estimate an amount of heat generation by the plurality of battery cells based on the temperature signal;
determine the electric current provided to the plurality of battery cells based on the electric current signal; and
estimate a resistance of the plurality of battery cells based on the estimated amount of heat generation and the electric current.

2. The electrical energy storage system of claim 1, the controller further including computer executable instructions stored in the computer readable medium to:
calculate an operating parameter of the plurality of battery cells based on the estimated resistance.

3. The electrical energy storage system of claim 2, wherein the operating parameter is selected from the group consisting of: a maximum state-of-charge of the plurality of battery cells, a maximum charging/discharging power of the plurality of battery cells, a power storage efficiency of the plurality of battery cells, and a health of the plurality of battery cells.

4. The electrical energy storage system of claim 2, the controller further including computer executable instructions stored in the computer readable medium to:
generate battery power setpoints for the plurality of battery cells based on the operating parameter.

5. The electrical energy storage system of claim 1, the controller further including computer executable instructions stored in the computer readable medium to:
predict a remaining life of the plurality of battery cells as a function of the estimated resistance.

6. The electrical energy storage system of claim 1, the controller further including computer executable instructions stored in the computer readable medium to:
estimate a rate of heat generation by the plurality of battery cells based on the temperature signal.

7. The electrical energy storage system of claim 6, further comprising a heating, ventilation, and air conditioning ("HVAC") system configured to cool the battery container.

8. The electrical energy storage system of claim 7, the controller further including computer executable instructions stored in the computer readable medium to:
estimate the rate of heat generation by the plurality of battery cells based on a rate at which heat is removed from the battery container by the HVAC system.

9. The electrical energy storage system of claim 6, the controller further including computer executable instructions stored in the computer readable medium to:
estimate the rate of heat generation by the plurality of battery cells based on a rate of heat flow into the battery container and a rate of heat flow out of the battery container.

10. The electrical energy storage system of claim 9, the controller further including computer executable instructions stored in the computer readable medium to:
estimate the rate of the heat generation by the plurality of battery cells based on a difference between the rate of heat flow out of the battery container and the rate of heat flow into the battery container.

11. A method for operating an electrical energy storage system, the method comprising:
storing electrical energy in a plurality of battery cells within a battery container;
measuring a temperature associated with the battery container;
measuring an electric current provided to the plurality of battery cells;
estimating an amount of heat generation by the plurality of battery cells based on the temperature associated with the battery container; and
estimating a resistance of the plurality of battery cells based on the estimated amount of heat generation and the electric current provided to the plurality of battery cells.

12. The method of claim 11, further comprising:
calculating an operating parameter of the plurality of battery cells based on the estimated resistance.

13. The method of claim 12, wherein the operating parameter is selected from the group consisting of: a maximum state-of-charge of the plurality of battery cells, a maximum charging/discharging power of the plurality of battery cells, a power storage efficiency of the plurality of battery cells, and a health of the plurality of battery cells.

14. The method of claim 12, further comprising:
generating battery power setpoints for the plurality of battery cells based on the operating parameter.

15. The method of claim 11, further comprising:
predicting a remaining life of the plurality of battery cells as a function of the estimated resistance.

16. The method of claim 11, further comprising:
estimating a rate of heat generation by the plurality of battery cells based on the temperature signal.

17. The method of claim 16, further comprising:
cooling the battery container using a heating, ventilation, and air conditioning ("HVAC") system.

18. The method of claim 17, further comprising:
estimating the rate of heat generation by the plurality of battery cells based on a rate at which heat is removed from the battery container by the HVAC system.

19. The method of claim 16, further comprising:
estimating the rate of heat generation by the plurality of battery cells based on a rate of heat flow into the battery container and a rate of heat flow out of the battery container.

20. The method of claim 19, further comprising:
estimating the rate of the heat generation by the plurality of battery cells based on a difference between the rate of heat flow out of the battery container and the rate of heat flow into the battery container.

* * * * *